(12) United States Patent
Mignot et al.

(10) Patent No.: US 11,600,519 B2
(45) Date of Patent: Mar. 7, 2023

(54) SKIP-VIA PROXIMITY INTERCONNECT

(71) Applicant: INTERNATIONAL BUSINESS MACHINES CORPORATION, Armonk, NY (US)

(72) Inventors: Yann Mignot, Slingerlands, NY (US); Hsueh-Chung Chen, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 128 days.

(21) Appl. No.: 16/572,045

(22) Filed: Sep. 16, 2019

(65) Prior Publication Data

US 2021/0082747 A1    Mar. 18, 2021

(51) Int. Cl.
| | |
|---|---|
| *H01L 21/768* | (2006.01) |
| *H01L 23/532* | (2006.01) |
| *H01L 23/528* | (2006.01) |
| *H01L 23/522* | (2006.01) |
| *H01L 21/311* | (2006.01) |
| *H01L 21/02* | (2006.01) |
| *H01L 21/027* | (2006.01) |

(52) U.S. Cl.
CPC .... *H01L 21/76816* (2013.01); *H01L 21/0245* (2013.01); *H01L 21/0276* (2013.01); *H01L 21/02458* (2013.01); *H01L 21/31133* (2013.01); *H01L 21/31144* (2013.01); *H01L 21/76811* (2013.01); *H01L 21/76831* (2013.01); *H01L 21/76897* (2013.01); *H01L 23/5226* (2013.01); *H01L 23/5283* (2013.01); *H01L 23/53209* (2013.01)

(58) Field of Classification Search
CPC ........... H01L 21/76816; H01L 23/5226; H01L 23/5283; H01L 21/76811; H01L 21/76897
USPC ......................................................... 257/774
See application file for complete search history.

(56) References Cited

U.S. PATENT DOCUMENTS

| | | | | |
|---|---|---|---|---|
| 4,840,923 A | * | 6/1989 | Flagello | H01L 21/4846 148/DIG. 164 |
| 5,227,013 A | * | 7/1993 | Kumar | H01L 21/486 219/121.85 |
| 5,444,021 A | * | 8/1995 | Chung | H01L 21/76816 438/696 |
| 5,489,554 A | * | 2/1996 | Gates | H01L 21/76898 257/E21.705 |
| 5,545,584 A | * | 8/1996 | Wuu | H01L 21/76877 257/E21.585 |

(Continued)

FOREIGN PATENT DOCUMENTS

| | | | | |
|---|---|---|---|---|
| EP | 0827195 A1 | * | 8/1997 | ........... H01L 21/768 |
| WO | WO-2012166451 A2 | * | 12/2012 | ....... H01L 21/76816 |

(Continued)

*Primary Examiner* — Victoria K. Hall
(74) *Attorney, Agent, or Firm* — Tutunjian & Bitetto, P.C.; L. Jeffrey Kelly

(57) ABSTRACT

A method of forming vias and skip vias is provided. The method includes forming a blocking layer on an underlying layer, and forming an overlying layer on the blocking layer. The method further includes opening a hole in the overlying layer that overlaps the blocking layer, and etching past the blocking layer into the underlying layer to form a second hole that is smaller than the hole in the overlying layer.

19 Claims, 11 Drawing Sheets

(56) References Cited

U.S. PATENT DOCUMENTS

| | | | | |
|---|---|---|---|---|
| 5,658,830 A * | 8/1997 | Jeng | H01L 21/76838 | 257/E21.582 |
| 5,717,251 A * | 2/1998 | Hayashi | G03F 7/095 | 257/386 |
| 5,726,098 A * | 3/1998 | Tsuboi | H01L 21/768 | 257/E21.575 |
| 5,795,823 A * | 8/1998 | Avanzino | H01L 21/76831 | 438/639 |
| 5,892,286 A * | 4/1999 | Toyoda | H01L 21/76816 | 257/775 |
| 5,926,698 A * | 7/1999 | Ohkubo | H01L 21/84 | 438/151 |
| 5,929,524 A * | 7/1999 | Drynan | H01L 23/5226 | 257/758 |
| 5,972,788 A * | 10/1999 | Ryan | H01L 21/76838 | 438/634 |
| 5,982,035 A * | 11/1999 | Tran | H01L 23/5226 | 257/750 |
| 6,001,414 A * | 12/1999 | Huang | H01L 21/76829 | 438/622 |
| 6,020,236 A * | 2/2000 | Lee | H01L 27/10852 | 257/E21.648 |
| 6,022,804 A * | 2/2000 | Yano | H01L 23/5226 | 257/E23.145 |
| 6,078,073 A * | 6/2000 | Habu | H01L 27/10873 | 257/296 |
| 6,093,632 A * | 7/2000 | Lin | H01L 21/7681 | 257/E21.579 |
| 6,097,052 A * | 8/2000 | Tanaka | H01L 21/76802 | 257/306 |
| 6,143,640 A * | 11/2000 | Cronin | H01L 21/76805 | 438/618 |
| 6,180,514 B1 * | 1/2001 | Yeh | H01L 21/76801 | 257/E21.576 |
| 6,187,671 B1 * | 2/2001 | Irinoda | H01L 21/76816 | 257/E21.577 |
| 6,245,664 B1 * | 6/2001 | Miyai | H01L 21/76802 | 257/E21.577 |
| 6,278,187 B1 * | 8/2001 | Takata | H01L 21/76819 | 257/758 |
| 6,280,641 B1 * | 8/2001 | Gaku | H05K 3/0035 | 216/17 |
| 6,312,985 B1 * | 11/2001 | Wu | H01L 21/76897 | 257/E21.013 |
| 6,313,029 B1 * | 11/2001 | Kim | H01L 21/76802 | 257/E21.577 |
| 6,316,368 B1 * | 11/2001 | Lin | H01L 21/0332 | 257/E21.035 |
| 6,417,094 B1 | 7/2002 | Zhao et al. | | |
| 6,441,494 B2 * | 8/2002 | Huang | H01L 21/76805 | 257/758 |
| 6,482,701 B1 * | 11/2002 | Ishikawa | H01L 21/3065 | 257/E21.218 |
| 6,498,092 B2 * | 12/2002 | Lee | H01L 21/76807 | 257/E21.579 |
| 6,501,178 B1 * | 12/2002 | Kuriyama | H01L 23/5226 | 257/758 |
| 6,590,165 B1 * | 7/2003 | Takada | H05K 3/421 | 174/266 |
| 6,664,639 B2 * | 12/2003 | Cleeves | H01L 23/5252 | 257/774 |
| 6,710,466 B2 * | 3/2004 | Park | H01L 21/76897 | 257/758 |
| 6,716,746 B1 * | 4/2004 | Kim | H01L 21/76897 | 257/E21.507 |
| 6,727,170 B2 * | 4/2004 | Takata | H01L 21/76819 | 257/758 |
| 6,729,001 B2 * | 5/2004 | Bureau | B06B 1/0629 | 156/253 |
| 6,750,404 B1 * | 6/2004 | Anslow | H05K 1/113 | 174/261 |
| 6,867,073 B1 * | 3/2005 | Enquist | H01L 21/76898 | 257/E21.597 |
| 6,933,224 B2 * | 8/2005 | Nejad | H01L 23/5226 | 438/622 |
| 6,994,949 B2 * | 2/2006 | Lee | H01L 21/7681 | 257/E21.579 |
| 7,005,350 B2 * | 2/2006 | Walker | H01L 27/115 | 257/344 |
| 7,211,510 B2 * | 5/2007 | Meadows | H01L 23/481 | 438/667 |
| 7,300,857 B2 * | 11/2007 | Akram | H01L 21/76877 | 438/459 |
| 7,312,400 B2 * | 12/2007 | Ito | H05K 3/4069 | 174/250 |
| 7,387,959 B2 * | 6/2008 | Nejad | H01L 23/5226 | 438/622 |
| 7,459,202 B2 * | 12/2008 | Magera | H05K 1/116 | 174/250 |
| 7,552,531 B2 * | 6/2009 | Takada | H05K 3/4652 | 29/852 |
| 7,564,135 B2 * | 7/2009 | Park | H01L 27/10888 | 257/758 |
| 7,682,966 B1 * | 3/2010 | Rozbicki | H01L 21/76843 | 438/637 |
| 7,932,173 B2 * | 4/2011 | Nejad | H01L 21/76805 | 438/622 |
| 8,114,769 B1 | 2/2012 | Srivastava et al. | | |
| 8,349,723 B2 * | 1/2013 | Filippi | H01L 21/76802 | 438/622 |
| 8,426,305 B2 * | 4/2013 | Nejad | H01L 21/76805 | 438/622 |
| 8,563,403 B1 | 10/2013 | Farooq et al. | | |
| 8,664,112 B2 * | 3/2014 | Sandhu | H01L 23/5283 | 438/637 |
| 8,835,305 B2 | 9/2014 | Yang et al. | | |
| 8,836,137 B2 * | 9/2014 | Chen | H01L 23/481 | 257/774 |
| 9,053,985 B2 * | 6/2015 | Tanaka | H01L 21/76805 | |
| 9,111,932 B2 * | 8/2015 | Sandhu | H01L 23/5283 | |
| 9,349,787 B1 * | 5/2016 | Lee | H01L 23/5226 | |
| 9,373,582 B1 * | 6/2016 | Feurprier | H01L 21/76897 | |
| 9,385,078 B1 * | 7/2016 | Feurprier | H01L 23/5226 | |
| 9,406,561 B2 * | 8/2016 | Farooq | H01L 25/50 | |
| 9,536,777 B2 * | 1/2017 | Lin | H01L 21/76898 | |
| 9,576,892 B2 * | 2/2017 | Chi | H01L 23/5226 | |
| 9,576,904 B2 * | 2/2017 | Sandhu | H01L 25/50 | |
| 9,613,862 B2 * | 4/2017 | Lenhardt | H01L 21/76879 | |
| 9,633,917 B2 * | 4/2017 | Tsai | H01L 24/03 | |
| 9,653,303 B2 | 5/2017 | Ooshima | | |
| 9,659,821 B1 * | 5/2017 | Chen | H01L 21/76813 | |
| 9,691,659 B1 | 6/2017 | Mignot et al. | | |
| 9,768,113 B2 * | 9/2017 | Feurprier | H01L 21/31116 | |
| 9,786,557 B1 | 10/2017 | Chi et al. | | |
| 9,793,164 B2 | 10/2017 | Machkaoutsan et al. | | |
| 9,799,559 B1 * | 10/2017 | Siddiqui | H01L 23/528 | |
| 9,805,972 B1 * | 10/2017 | Zhang | H01L 21/76877 | |
| 9,805,977 B1 | 10/2017 | Sukumaran et al. | | |
| 9,911,651 B1 * | 3/2018 | Briggs | H01L 21/76805 | |
| 10,020,254 B1 * | 7/2018 | Bao | H01L 23/5226 | |
| 10,020,255 B1 * | 7/2018 | Bao | H01L 21/76879 | |
| 10,026,687 B1 * | 7/2018 | Lin | H01L 21/76879 | |
| 10,096,515 B2 * | 10/2018 | Tsai | H01L 25/50 | |
| 10,121,754 B2 | 11/2018 | Oliver et al. | | |
| 10,181,420 B2 | 1/2019 | Stephens et al. | | |
| 10,304,818 B2 * | 5/2019 | Tsai | H01L 25/0657 | |
| 10,312,188 B1 * | 6/2019 | Srivastava | H01L 21/76843 | |
| 10,319,629 B1 * | 6/2019 | Yang | H01L 21/76897 | |
| 10,340,205 B2 * | 7/2019 | Lin | H01L 23/49827 | |
| 10,347,528 B1 * | 7/2019 | Singh | H01L 21/76843 | |
| 10,607,922 B1 * | 3/2020 | Mignot | H01L 21/76885 | |
| 10,615,027 B1 * | 4/2020 | Fan | H01L 21/02244 | |
| 10,622,301 B2 * | 4/2020 | Xu | H01L 21/02118 | |
| 11,011,463 B2 * | 5/2021 | Lin | H01L 23/528 | |
| 11,037,821 B2 * | 6/2021 | Yang | H01L 23/5283 | |
| 11,037,822 B2 * | 6/2021 | Mignot | H01L 21/31116 | |
| 11,049,814 B2 * | 6/2021 | Kim | H01L 23/5386 | |
| 11,056,426 B2 * | 7/2021 | Mignot | H01L 21/76807 | |
| 11,302,570 B2 * | 4/2022 | Liu | H01L 21/76897 | |

(56) References Cited

U.S. PATENT DOCUMENTS

| | | | |
|---|---|---|---|
| 2001/0029100 A1* | 10/2001 | Huang | H01L 21/76816 438/638 |
| 2001/0030365 A1* | 10/2001 | Otsuka | H01L 23/5226 257/758 |
| 2002/0030280 A1* | 3/2002 | Lee | H01L 21/7681 257/774 |
| 2002/0081841 A1* | 6/2002 | Ireland | H01L 27/10888 438/672 |
| 2003/0015796 A1* | 1/2003 | Hasunuma | H01L 21/76897 257/758 |
| 2004/0115923 A1* | 6/2004 | Macneil | H01L 21/0272 438/622 |
| 2005/0085067 A1* | 4/2005 | Sir | H01L 23/49827 438/637 |
| 2006/0017162 A1* | 1/2006 | Seta | H01L 21/3081 257/E21.507 |
| 2006/0246710 A1* | 11/2006 | Cheong | H01L 21/76846 438/618 |
| 2006/0270215 A1* | 11/2006 | Lee | H01L 21/8221 438/637 |
| 2007/0037385 A1* | 2/2007 | Huebinger | H01L 21/76814 438/638 |
| 2007/0134917 A1 | 6/2007 | Li et al. | |
| 2007/0170486 A1* | 7/2007 | Park | H01L 27/10814 257/306 |
| 2009/0032955 A1* | 2/2009 | Tanaka | H01L 23/5226 257/758 |
| 2009/0206491 A1* | 8/2009 | Wada | H01L 21/76816 257/774 |
| 2009/0224330 A1* | 9/2009 | Hong | H01L 27/11 257/368 |
| 2009/0239375 A1* | 9/2009 | Riess | H01L 23/53238 438/640 |
| 2010/0022086 A1* | 1/2010 | Choi | H01L 27/11543 438/653 |
| 2010/0025853 A1 | 2/2010 | Lindgren et al. | |
| 2010/0044858 A1* | 2/2010 | Cohn | H01L 23/544 257/734 |
| 2010/0227471 A1 | 9/2010 | Leung et al. | |
| 2011/0039413 A1* | 2/2011 | Akinmade-Yusuff | H01L 21/0335 438/700 |
| 2011/0073997 A1* | 3/2011 | Leuschner | H01L 21/76898 257/621 |
| 2011/0092069 A1* | 4/2011 | Cheng | H01L 21/76829 438/672 |
| 2011/0175226 A1* | 7/2011 | Bonilla | H01L 21/76847 257/751 |
| 2011/0195547 A1* | 8/2011 | Sandhu | H01L 23/5329 438/129 |
| 2011/0204482 A1* | 8/2011 | Dirnecker | H01L 28/24 257/536 |
| 2012/0100712 A1* | 4/2012 | Filippi | H01L 23/5226 438/643 |
| 2012/0193785 A1* | 8/2012 | Lin | H01L 24/97 257/737 |
| 2013/0082401 A1* | 4/2013 | Fukasawa | H01L 23/5226 257/774 |
| 2013/0248990 A1* | 9/2013 | Kim | H01L 21/76885 257/330 |
| 2013/0252416 A1* | 9/2013 | Takeda | H01L 25/0657 438/630 |
| 2014/0151893 A1* | 6/2014 | Boyanov | H01L 21/76816 257/774 |
| 2014/0217612 A1* | 8/2014 | Bao | H01L 23/5256 257/775 |
| 2014/0284813 A1* | 9/2014 | Greco | H01L 21/31144 257/774 |
| 2015/0001735 A1* | 1/2015 | Mignot | H01L 23/5226 257/774 |
| 2015/0130066 A1* | 5/2015 | Chen | H01L 23/5226 257/773 |
| 2015/0206797 A1* | 7/2015 | Meinhold | H01L 21/76834 438/652 |
| 2015/0221695 A1* | 8/2015 | Park | H01L 25/0657 257/774 |
| 2015/0243568 A1 | 8/2015 | Fischer et al. | |
| 2015/0318263 A1* | 11/2015 | Yu | H01L 23/522 257/774 |
| 2015/0348874 A1* | 12/2015 | Tsai | H01L 23/481 257/774 |
| 2016/0013118 A1* | 1/2016 | Tsai | H01L 23/481 257/774 |
| 2016/0336225 A1* | 11/2016 | Chen | H01L 21/76885 |
| 2016/0351447 A1* | 12/2016 | Chen | E04B 1/34357 |
| 2016/0365271 A1* | 12/2016 | Chang | H01L 21/76811 |
| 2016/0365275 A1* | 12/2016 | Chang | H01L 21/76813 |
| 2016/0379929 A1* | 12/2016 | Feurprier | H01L 21/76808 257/774 |
| 2017/0062331 A1* | 3/2017 | Lenhardt | H01L 23/5226 |
| 2017/0110402 A1* | 4/2017 | Smith | H01L 21/76831 |
| 2017/0179021 A1* | 6/2017 | Cheng | H01L 21/76843 |
| 2017/0194248 A1 | 7/2017 | Das | |
| 2017/0229397 A1* | 8/2017 | Ting | H01L 21/76831 |
| 2017/0278740 A1* | 9/2017 | Briggs | H01L 21/76897 |
| 2017/0338115 A1* | 11/2017 | Yen | H01L 21/76802 |
| 2018/0005874 A1* | 1/2018 | Mignot | H01L 21/76811 |
| 2018/0025936 A1* | 1/2018 | Singh | H01L 21/0332 438/618 |
| 2018/0061700 A1* | 3/2018 | Sun | H01L 21/02063 |
| 2018/0090511 A1* | 3/2018 | Nakajima | H01L 23/5226 |
| 2018/0114752 A1* | 4/2018 | Briggs | H01L 23/528 |
| 2018/0130699 A1* | 5/2018 | Zhang | H01L 23/5226 |
| 2018/0174897 A1* | 6/2018 | Feurprier | H01L 21/76826 |
| 2018/0174960 A1* | 6/2018 | Smith | H01L 21/76831 |
| 2018/0197874 A1* | 7/2018 | Oshiki | H01L 21/76877 |
| 2018/0261536 A1* | 9/2018 | Zhang | H01L 21/76816 |
| 2018/0269150 A1 | 9/2018 | Lin et al. | |
| 2018/0342454 A1* | 11/2018 | Zhang | H01L 21/76816 |
| 2019/0006222 A1* | 1/2019 | Or-Bach | H01L 21/6835 |
| 2019/0021176 A1* | 1/2019 | Law | H01L 23/5226 |
| 2019/0027401 A1* | 1/2019 | McMahon | H01L 21/76826 |
| 2019/0189452 A1* | 6/2019 | Chung | H01L 29/517 |
| 2019/0244896 A1* | 8/2019 | Lee | H01L 21/76804 |
| 2019/0252305 A1* | 8/2019 | Peng | H01L 23/49816 |
| 2019/0311944 A1* | 10/2019 | Park | H01L 21/76826 |
| 2019/0333805 A1* | 10/2019 | O'Toole | H01L 21/76813 |
| 2019/0355621 A1* | 11/2019 | Marcadal | H01L 21/76879 |
| 2020/0013715 A1* | 1/2020 | Park | H01L 21/76811 |
| 2020/0051859 A1* | 2/2020 | Sun | H01L 21/76811 |
| 2020/0075618 A1* | 3/2020 | Oike | H01L 27/11519 |
| 2020/0105590 A1* | 4/2020 | Li | H01L 21/76804 |
| 2020/0105664 A1* | 4/2020 | Han | H01L 21/76829 |
| 2020/0111736 A1* | 4/2020 | Amanapu | H01L 21/76816 |
| 2020/0111798 A1* | 4/2020 | Paul | H01L 21/76805 |
| 2020/0266150 A1* | 8/2020 | Kim | H01L 23/528 |
| 2020/0279806 A1* | 9/2020 | Lin | H01L 23/53238 |
| 2020/0357692 A1* | 11/2020 | Mignot | H01L 21/76816 |
| 2020/0381354 A1* | 12/2020 | Mignot | H01L 21/76897 |
| 2020/0388567 A1* | 12/2020 | Mignot | H01L 23/5226 |
| 2020/0395294 A1* | 12/2020 | Liang | H01L 21/76816 |
| 2020/0411427 A1* | 12/2020 | Lin | H01L 23/528 |
| 2021/0043500 A1* | 2/2021 | Lin | H01L 21/76816 |

FOREIGN PATENT DOCUMENTS

| | | | | |
|---|---|---|---|---|
| WO | WO-2015026342 A1 * | 2/2015 | ......... | H01L 21/0337 |
| WO | WO-2018037667 A1 * | 3/2018 | ....... | H01L 27/14601 |
| WO | WO-2018038786 A1 * | 3/2018 | ........... | H01L 29/768 |
| WO | WO-2019182872 A1 * | 9/2019 | ........... | H01L 21/768 |
| WO | WO-2020037489 A1 * | 2/2020 | ........ | H01L 27/11548 |

* cited by examiner

SKIP-VIA PROXIMITY INTERCONNECT

BACKGROUND

The present invention generally relates to back-end-of-line metallization layers, and more particularly to skip-via formation in back-end-of-line metallization processes.

Semiconductor devices on a semiconductor chip are electrically connected to the packaging connections using multiple metallization layers. Vias can interconnect different metallization layers, where some vias can skip an intervening metallization layer to be a skip via or super via.

SUMMARY

In accordance with an embodiment of the present invention, a method of forming vias and skip vias is provided. The method includes forming a blocking layer on an underlying layer, and forming an overlying layer on the blocking layer. The method further includes opening a hole in the overlying layer that overlaps the blocking layer, and etching past the blocking layer into the underlying layer to form a second hole that is smaller than the hole in the overlying layer.

In accordance with another embodiment of the present invention, a method of forming vias and skip vias is provided. The method includes forming a plurality of first metallization layer sections in a first dielectric layer on a substrate, and forming a plurality of second metallization layer sections in a second dielectric layer. The method further includes forming a patterned resist layer over second metallization layer sections, first metallization layer sections, and an arrangement of conductive lines on a substrate, wherein the patterned resist layer has one or more resist openings with at least one resist opening in the patterned resist layer laterally aligned with one second metallization layer section, one first metallization layer section, or one conductive line, wherein the at least one resist opening overlaps the edge of the one second metallization layer section, the one first metallization layer section, or the one conductive line. The method further includes extending the one or more resist openings through an intervening fourth organic planarization layer and third capping layer to the at least one second metallization layer section, one first metallization layer section, or one conductive line to form one or more trenches. The method further includes filling the one or more trenches with a fourth metallization layer, wherein the fourth metallization layer is in physical and electrical contact with at least one second metallization layer section, at least one first metallization layer section, and at least one conductive line.

In accordance with another embodiment of the present invention, a device is provided. The device includes an arrangement of conductive lines on a substrate, and a first capping layer on the substrate and the arrangement of conductive lines. The device further includes a first dielectric layer on the first capping layer, and a plurality of first metallization layer sections in a first dielectric layer that are in electrical contact with the arrangement of conductive lines. The device further includes a second capping layer on the first metallization layer sections, and a second dielectric layer on the second capping layer. The device further includes one or more vias between second metallization layer sections and first metallization layer sections, and one or more skip via(s) to at least one of the arrangement of conductive lines, wherein the second metallization layer sections define the edges of the vias, so the second dielectric layer does not have chamfering.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a method of fabrication vias and skip vias (also referred to as super vias) allowing reduced line design for smaller footprints by placing the vias at the ends of conductive lines. The method can form a first metallization layer, M1, followed by a second metallization layer, M2 and first set of vias, V1 (M2V1), followed by a third metallization layer, M3, followed by skip-vias SVIA1 and a second set of vias, V2. Placing the vias at conductive line ends can allow reduced space line lengths on the metallization layers and reduced spacing overall without having R/C penalties. The method can eliminate a wet chemical removal step for at least one hardmask layer from a lower metal layer.

Embodiments of the present invention provide a method of fabrication via(s) and skip via(s) without chamfers on the second dielectric layer, as the via(s) and skip via(s) are defined after the trench metallization.

Embodiments of the present invention provide a back-end-of-line metallization architecture having reduced design conductive line lengths and self-aligned vias and skip vias.

Exemplary applications/uses to which the present invention can be applied include, but are not limited to: digital logic devices, digital memory devices, microprocessors, digital controllers, and other fabricated chip circuits.

It is to be understood that aspects of the present invention will be described in terms of a given illustrative architecture; however, other architectures, structures, substrate materials and process features and steps can be varied within the scope of aspects of the present invention.

Figure 1:
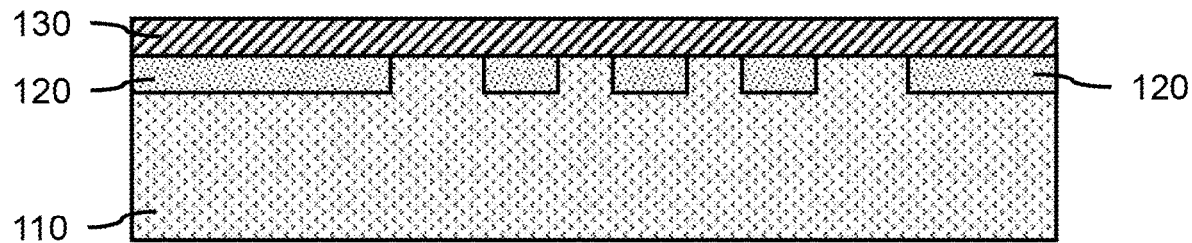
FIG. 1 is a cross-sectional side view showing an arrangement of conductive lines on a substrate, and a first capping layer on the conductive lines and substrate, in accordance with an embodiment of the present invention.

Referring now to the drawings in which like numerals represent the same or similar elements and initially to FIG. 1, a cross-sectional side view of an arrangement of conductive lines on a substrate, and a first capping layer on the conductive lines and substrate is shown, in accordance with an embodiment of the present invention.

In one or more embodiments, an arrangement of conductive lines 120 can be formed on a substrate 110, where the conductive lines 120 can be electrical contacts to one or more devices in the substrate. The conductive lines 120 can be formed by etching trenches in, for example, an interlayer dielectric (ILD) layer and depositing a conductive material in the trenches. The devices in the substrate 110 can be one or more active devices, e.g., transistors, one or more passive devices, e.g., resistors, capacitors, inductors, and combinations thereof.

In one or more embodiments, the substrate 110 can include one or more layers of a dielectric material, including, but not limited to, silicon oxide (SiO), silicon nitride (SiN), low-k dielectric materials, high-k dielectric materials, and combinations thereof.

In one or more embodiments, the conductive lines 120 can be a conductive material and metal liner based on the selected materials, including, but not limited to, metals, (e.g., copper (Cu), cobalt (Co), aluminum (Al), gold (Au), silver (Ag), tungsten (W), ruthenium (Ru), molybdenum (Mo)), conductive metal compounds (e.g., tantalum nitride (TaN), titanium nitride (TiN), tantalum carbide (TaC), titanium carbide (TiC)), metal alloys (e.g., titanium aluminum (TiAl), graphene, carbon nanotubes, and combinations thereof.

In one or more embodiments, a first capping layer 130 can be formed on the substrate 110 and conductive lines 120, where the first capping layer can be formed by a conformal deposition, for example, atomic layer deposition (ALD) and plasma enhanced ALD (PEALD), a blanket deposition, for example, chemical vapor deposition (CVD) and plasma enhanced CVD (PECVD), or a combination thereof.

In various embodiments, the first capping layer 130 can be a hardmask material, including, but not limited to, silicon nitride (SiN), silicon oxy nitride (SiON), silicon boronitride (SiBN), silicon carbo nitride (SiCN), silicon boro carbonitride (SiBCN), and combinations thereof.

In various embodiments, the first capping layer 130 can have a thickness in a range of about 5 nanometers (nm) to about 50 nm, or about 10 nm to about 30 nm, or about 15 nm to about 20 nm, although other thicknesses are also contemplated. The first capping layer 130 can be sufficiently thick to prevent metal atoms of the conductive lines 120 from diffusing into overlying layers, particularly if copper (Cu) is the material used for conductive lines 120.

Figure 2:
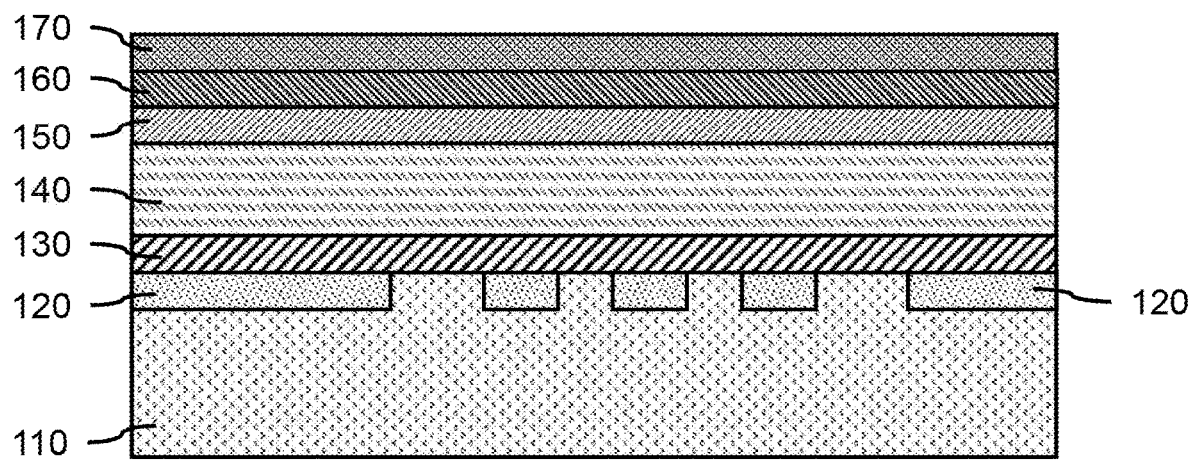
FIG. 2 is a cross-sectional side view showing a first etch-stop layer formed on the first capping layer, a first hardmask layer formed on the first etch-stop layer, a first softmask layer formed on the first hardmask layer, in accordance with an embodiment of the present invention.

FIG. 2 is a cross-sectional side view showing a first etch-stop layer formed on the first capping layer, a first hardmask layer formed on the first etch-stop layer, a first softmask layer formed on the first hardmask layer, in accordance with an embodiment of the present invention.

In one or more embodiments, a first dielectric layer 140 can be formed on the first capping layer 130, where the first dielectric layer 140 can be formed by a blanket deposition, including, but not limited to, chemical vapor deposition (CVD), plasma enhanced CVD (PECVD), spin-on, and combinations thereof. The first dielectric layer 140 can cover at least a portion of the first capping layer 130.

In various embodiments, the dielectric layers 140 can be electrically insulating materials, including, but not limited to, silicon oxide (SiO), a low-k dielectric material having a dielectric constant (k value) less than 3.9, which is the dielectric constant of silicon dioxide (SiO2), and combinations thereof. The dielectric material can include, but not necessarily be limited to, silicon dioxide (SiO2), silsesquixoanes, carbon-doped silicon oxide (SiCOH), SiLK™ dielectrics (available from the Dow Chemical Company), or multi-layers thereof. In various embodiments, the dielectric material can include porous or non-porous forms of these low-k dielectric films.

In various embodiments, the first dielectric layer 140 can have a thickness in a range of about 60 nm to about 200 nm, or about 100 nm to about 150 nm, although other thicknesses are also contemplated.

In one or more embodiments, a first etch-stop layer 150 can be formed on the first dielectric layer 140, where the first etch-stop layer 150 can be formed by a blanket deposition. In various embodiments, the first etch-stop layer 150 can be a dielectric material, including, but not limited to, silicon nitride (SiN), silicon boronitride (SiBN), silicon carbonitride (SiCN), silicon boro carbonitride (SiBCN), and combinations thereof.

In various embodiments, the first etch-stop layer 150 can have a thickness in a range of about 5 nm to about 30 nm, or about 5 nm to about 15 nm, or about 10 nm to about 30 nm, although other thicknesses are also contemplated. The first etch-stop layer 150 can be thick enough to allow a pattern to be etched into an overlying first hardmask layer without reaching the underlying first dielectric layer 140.

In one or more embodiments, a first hardmask layer 160 can be formed on the first etch-stop layer 150, where the first hardmask layer 160 can be formed by a blanket deposition. In various embodiments, the first hardmask layer 160 can be a metal compound material, including, but not limited to, titanium nitride (TiN), tantalum nitride (TaN), tungsten nitride (WN), titanium carbide (TiC), tantalum carbide (TaC), and combinations thereof.

In various embodiments, the first hardmask layer 160 can have a thickness in a range of about 5 nm to about 50 nm, or about 5 nm to about 30 nm, or about 10 nm to about 50 nm, although other thicknesses are also contemplated.

In one or more embodiments, a first softmask layer 170 can be formed on the first hardmask layer 160, where the first softmask layer 170 can be formed by CVD, PECVD, ALD and combinations thereof. In various embodiments, the first softmask layer 170 can be tetraethyl orthosilicate (TEOS), where the TEOS can be deposited to form a silicon oxide (SiO) layer on the first hardmask layer 160.

In various embodiments, the first softmask layer 170 can have a thickness in a range of about 5 nm to about 50 nm, or about 5 nm to about 30 nm, or about 10 nm to about 50 nm, although other thicknesses are also contemplated.

Figure 3:
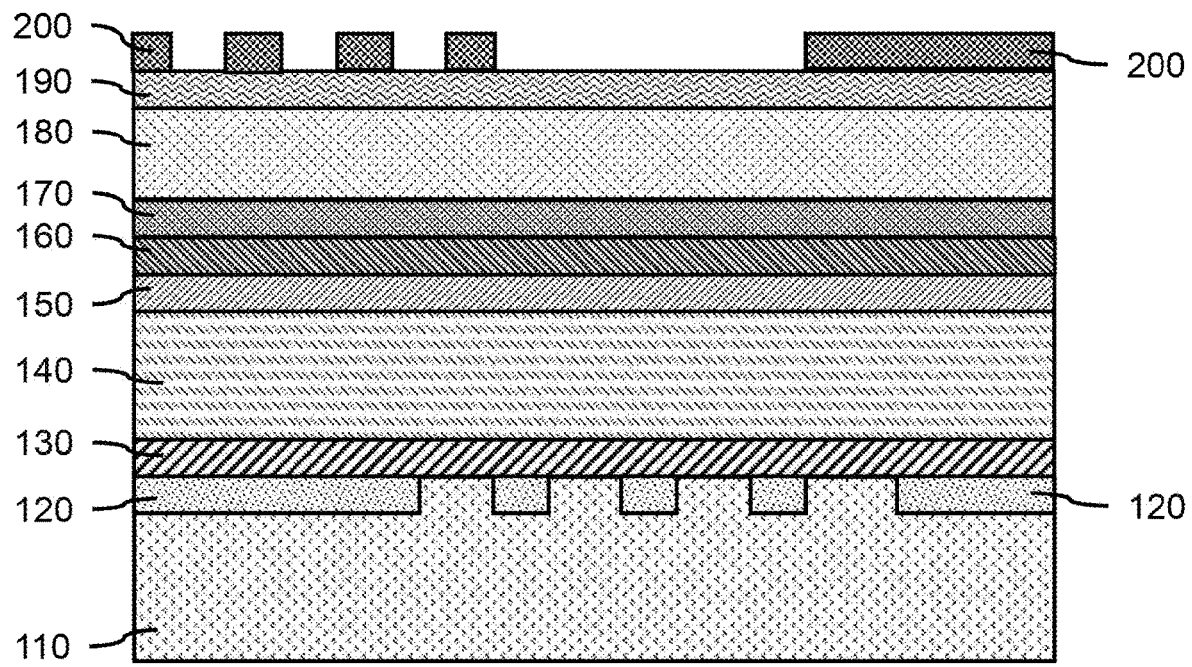
FIG. 3 is a cross-sectional side view showing a first organic planarization layer (OPL) formed on the first softmask layer, a first silicon anti-reflection coating layer formed on the first OPL layer, and a first patterned resist layer formed on the first silicon anti-reflection coating layer, in accordance with an embodiment of the present invention.

FIG. 3 is a cross-sectional side view showing a first organic planarization layer (OPL) formed on the first softmask layer, a first silicon anti-reflection coating layer formed on the first OPL layer, and a first patterned resist layer formed on the first silicon anti-reflection coating layer, in accordance with an embodiment of the present invention.

In one or more embodiments, a first organic planarization layer (OPL-1) 180 can be formed on the first softmask layer 170, where the first organic planarization layer (OPL-1) 180 can be formed by a spin-on processes. In various embodiments, the first organic planarization layer (OPL-1) 180 can be a photo-sensitive organic polymer, including, but not limited to, polyacrylate resin, epoxy resin, phenol resin, polyamide resin, polyimide resin, unsaturated polyester resin, polyphenylenether resin, polyphenylenesulfide resin, benzocyclobutene (BCB), and combinations thereof. The first organic planarization layer (OPL-1) 180 can be a light-sensitive material that is chemically altered when exposed to electromagnetic radiation.

In various embodiments, the first organic planarization layer (OPL-1) 180 can have a thickness in a range of about 60 nm to about 200 nm, or about 60 nm to about 150 nm, or about 100 nm to about 200 nm, although other thicknesses are also contemplated.

In one or more embodiments, a first silicon anti-reflection coating (SiARC) layer 190 can be formed on the first OPL layer 180, where the first SiARC layer 190 can be formed by a blanket deposition (e.g., CVD, PECVD, spin-on process, combinations thereof). The SiARC layer 190 can include a silicon-containing base polymer.

In various embodiments, the first SiARC layer 190 can have a thickness in a range of about 10 nm to about 65 nm, or about 10 nm to about 35 nm, or about 15 nm to about 65 nm, although other thicknesses are also contemplated.

In one or more embodiments, a first patterned resist layer 200 can be formed on the first silicon anti-reflection coating layer 190, where the resist layer can be formed by a spin-on process and patterned using lithography techniques. The resist layer can be patterned to expose predetermined portions of the underlying SiARC layer 190. The opening in the first patterned resist layer 200 that expose portions of the SiARC layer 190 can be positioned above particular components of the arrangement of conductive lines 120, so subsequent etching can form trenches for a second metallization layer where vias and connecting conductive lines are intended to be formed.

Figure 4:
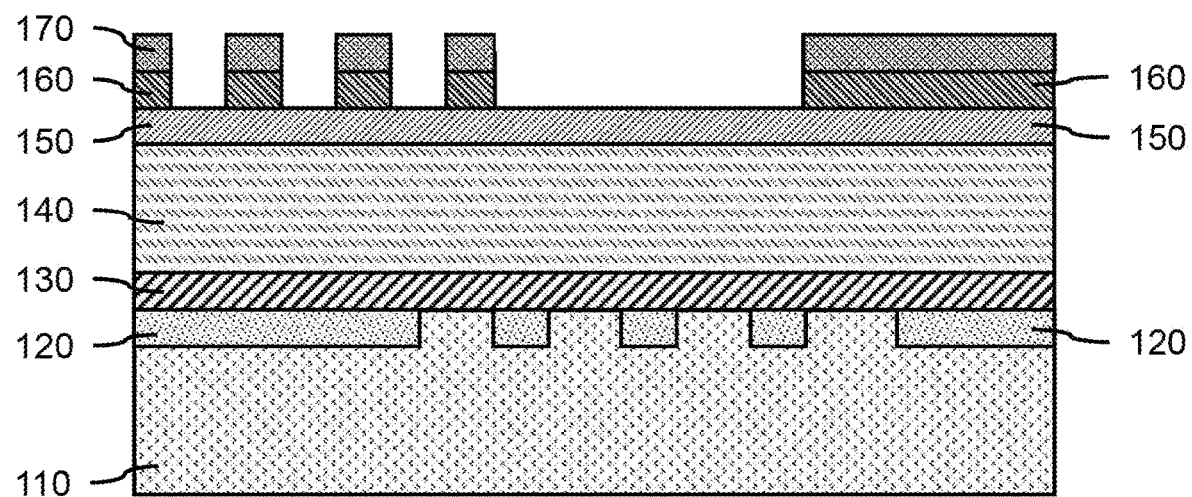
FIG. 4 is a cross-sectional side view showing the pattern of openings in the first resist layer transferred through the intervening SiARC layer and first organic planarization layer to the first softmask layer and first hardmask layer, in accordance with an embodiment of the present invention.

FIG. 4 is a cross-sectional side view showing the pattern of openings in the first resist layer transferred through the intervening SiARC layer and first organic planarization layer to the first softmask layer and first hardmask layer, in accordance with an embodiment of the present invention.

In one or more embodiments, the pattern of openings from the first patterned resist layer 200 can be transferred to the exposed portions of the SiARC layer 190 and underlying OPL layer 180 to the first softmask layer 170 and first hardmask layer 160 using a directional etch, for example, a reactive ion etch (RIE). The directional etching can stop at the first etch-stop layer 150. Removal of the SiARC layer 190 and OPL layer 180 can expose the remaining portions of the first softmask layer 170 and first hardmask layer 160. Portions of the first etch-stop layer 150 can be exposed between the remaining portions of the first softmask layer 170 and first hardmask layer 160. The stacks of the remaining segments of the first softmask layer 170 and first hardmask layer 160 can be located over the arrangement of conductive lines 120.

Figure 5:
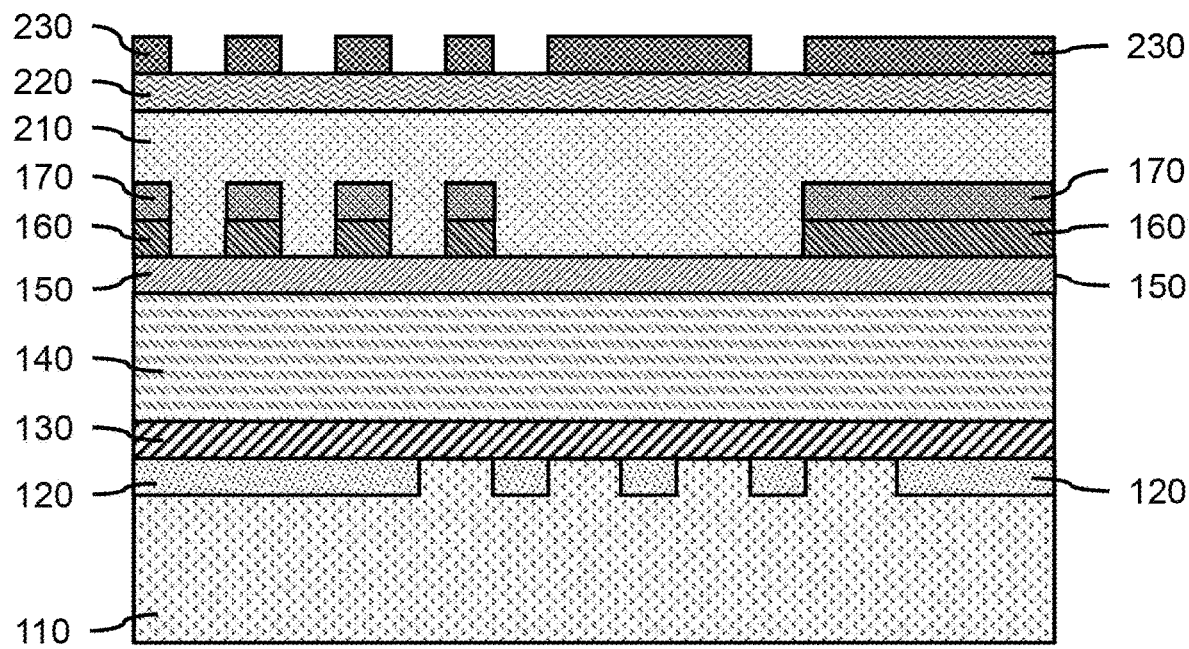
FIG. 5 is a cross-sectional side view showing a second organic planarization layer (OPL-2) filling in the openings transferred to the first hardmask layer and first softmask layer, a second SiARC layer formed on the second OPL layer, and a second patterned resist layer formed on the fourth capping layer, in accordance with an embodiment of the present invention.

FIG. 5 is a cross-sectional side view showing a second organic planarization layer (OPL-2) filling in the openings transferred to the first hardmask layer and first softmask layer, a second SiARC layer formed on the second OPL layer, and a second patterned resist layer formed on the fourth capping layer, in accordance with an embodiment of the present invention.

In one or more embodiments, a second organic planarization layer (OPL-2) 210 can be formed on the patterned first softmask layer 170 and first hardmask layer 160, where the second organic planarization layer 210 can be formed by a blanket deposition (e.g., spin-on). A second SiARC layer 220 can be formed on the second OPL layer 210 by a blanket deposition.

In one or more embodiments, a second patterned resist layer 230 can be formed on the second SiARC layer 220, where the resist layer can be formed by a spin-on process and patterned using lithography techniques. The resist layer can be patterned to expose predetermined portions of the underlying SiARC layer 220.

Figure 6:
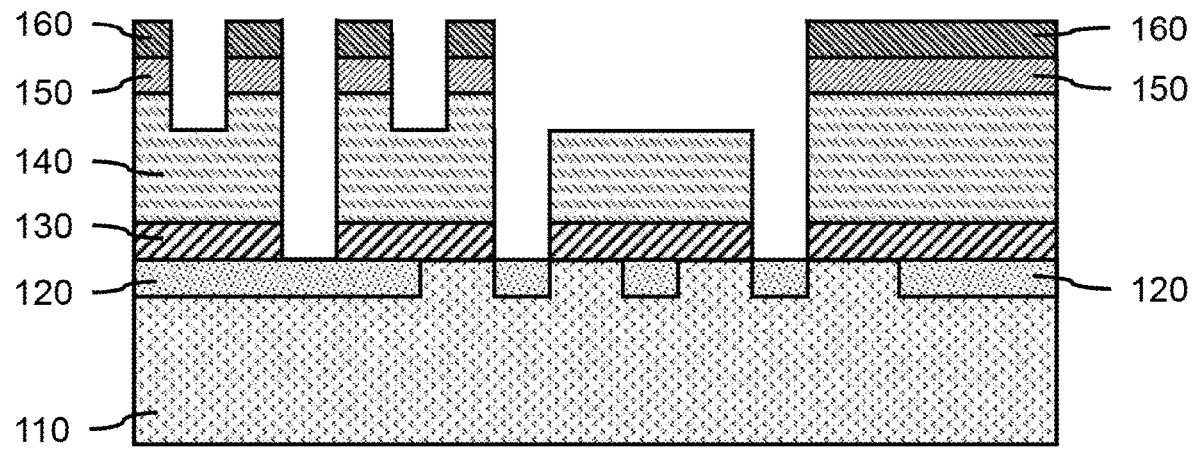
FIG. 6 is a cross-sectional side view showing the pattern of the second patterned resist layer transferred from the second SiARC layer, second OPL layer to the first hardmask layer, first etch-stop layer, and into the first dielectric layer, in accordance with an embodiment of the present invention.

FIG. 6 is a cross-sectional side view showing the pattern of the second patterned resist layer transferred from the second SiARC layer, second OPL layer to the first hardmask layer, first etch-stop layer, and into the first dielectric layer, in accordance with an embodiment of the present invention.

In one or more embodiments, a directional etch (e.g., RIE) can be used to remove portions of the underlying layers 220, 210, 140, 130, exposed through the openings in the second patterned resist layer 230. Portions of first dielectric layer 140 and first capping layer 130 can be removed using the directional etch to form trenches extending to the arrangement of conductive lines 120 to form vias.

Figure 7:
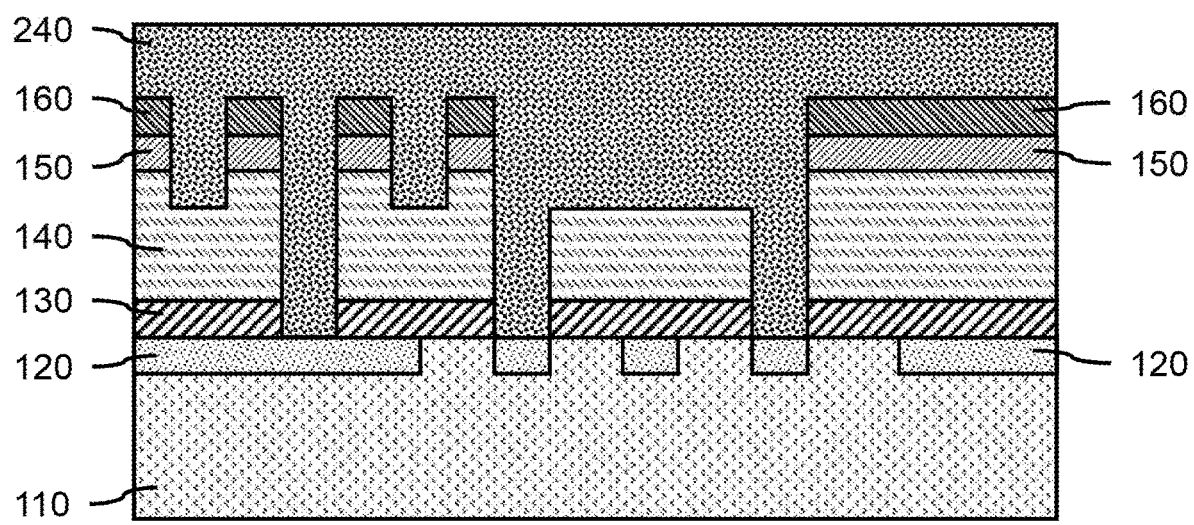
FIG. 7 is a cross-sectional side view showing a first metallization layer filling in the openings transferred to the first hardmask layer, first etch-stop layer, and into the first dielectric layer and first capping layer, in accordance with an embodiment of the present invention.

FIG. 7 is a cross-sectional side view showing a first metallization layer filling in the openings transferred to the first hardmask layer, first etch-stop layer, and into the first dielectric layer and first capping layer, in accordance with an embodiment of the present invention.

In one or more embodiments, a first metallization layer 240 can be formed on the first hardmask layer 160, first dielectric layer 140, and first capping layer 130 that fills in the openings and trenches. In various embodiments, the first metallization layer 240 can be in physical contact and electrical connection with different sections of the conductive lines 120 in the substrate 110. The trenches can be positioned so portions of the first metallization layer 240 are in physical and electrical contact with predetermined sections of the conductive lines 120 providing connections to active and passive devices in the substrate 110. Other sections of the conductive lines 120 may not be in physical and electrical contact with the first metallization layer 240.

In various embodiments, the first metallization layer 240 can be a conductive material, including, but not limited to, metals, (e.g., copper (Cu), cobalt (Co), aluminum (Al), gold (Au), silver (Ag), tungsten (W), ruthenium (Ru), molybdenum (Mo)), conductive metal compounds (e.g., tantalum nitride (TaN), titanium nitride (TiN), tantalum carbide (TaC), titanium carbide (TiC)), metal alloys (e.g., titanium aluminum (TiAl), graphene, carbon nanotubes, and combinations thereof.

In various embodiments, first etch-stop layer 150 and first hardmask layer 160 can be removed prior to forming the first metallization layer 240, for example, by using a directional etch and/or an isotropic etch (e.g., wet chemical etch).

Figure 8:
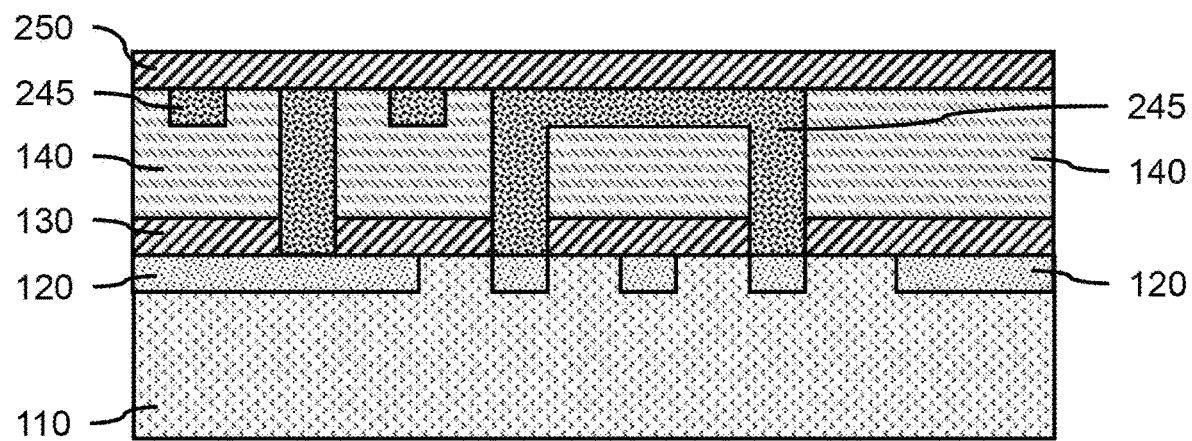
FIG. 8 is a cross-sectional side view showing the first metallization layer planarized, the first softmask layer and first hardmask layer removed, and a second capping layer formed on the first metallization layer segments and first dielectric layer, in accordance with an embodiment of the present invention.

FIG. 8 is a cross-sectional side view showing the first metallization layer planarized, the first softmask layer and first hardmask layer removed, and a second capping layer formed on the first metallization layer segments and first dielectric layer, in accordance with an embodiment of the present invention.

In one or more embodiments, portions of the first metallization layer 240, first hardmask layer 160, and first etch-stop layer 150 can be removed using, for example, a chemical-mechanical polishing (CMP) to leave first metallization layer sections 245 in the first dielectric layer 140.

In one or more embodiments, a second capping layer 250 can be formed on the first metallization layer sections 245 and first dielectric layer 140, for example, by a conformal deposition, for example, atomic layer deposition (ALD) and plasma enhanced ALD (PEALD), a blanket deposition, for example, chemical vapor deposition (CVD) and plasma enhanced CVD (PECVD), or a combination thereof.

In various embodiments, the second capping layer 250 can be a hardmask material, including, but not limited to, silicon nitride (SiN), silicon oxy nitride (SiON), silicon boronitride (SiBN), silicon carbo nitride (SiCN), silicon boro carbonitride (SiBCN), and combinations thereof.

In various embodiments, the second capping layer 250 can have a thickness in a range of about 5 nanometers (nm) to about 50 nm, or about 10 nm to about 30 nm, or about 15 nm to about 20 nm, although other thicknesses are also contemplated. The second capping layer 250 can be sufficiently thick to prevent metal atoms of the first metallization layer sections 245 from diffusing into overlying layers.

Figure 9:
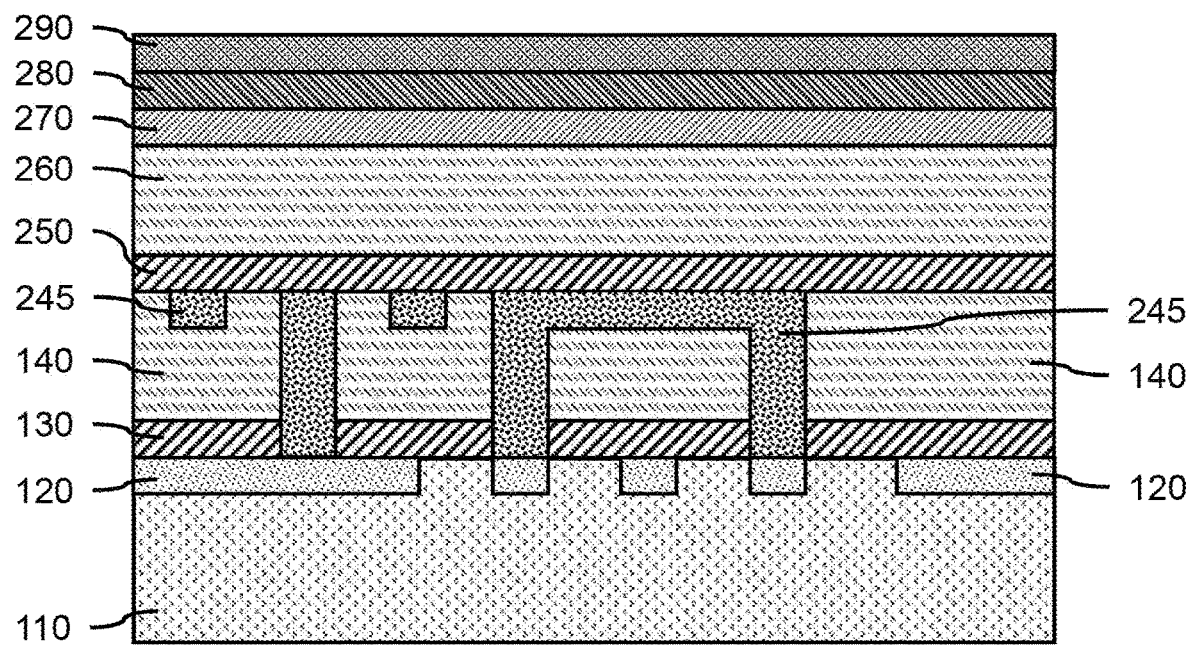
FIG. 9 is a cross-sectional side view showing a second dielectric layer formed on the second capping layer, a third etch-stop layer formed on the second dielectric layer, a third hardmask layer formed on the third etch-stop layer, and a third softmask layer formed on the third hardmask layer, in accordance with an embodiment of the present invention.

FIG. 9 is a cross-sectional side view showing a second dielectric layer formed on the second capping layer, a third etch-stop layer formed on the second dielectric layer, a third hardmask layer formed on the third etch-stop layer, and a third softmask layer formed on the third hardmask layer, in accordance with an embodiment of the present invention.

In one or more embodiments, a second dielectric layer 260 can be formed on the second capping layer 250 by a blanket deposition (e.g., CVD, PECVD, spin-on). The second dielectric layer 260 can be selected from the same materials as the first dielectric layer 140, and can be the same material as the first dielectric layer 140.

In various embodiments, the second dielectric layer 260 can have a thickness in a range of about 60 nm to about 200 nm, or about 100 nm to about 150 nm, although other thicknesses are also contemplated.

In one or more embodiments, a third etch-stop layer 270 can be formed on the second dielectric layer 260, where the third etch-stop layer 270 can be formed by a blanket deposition. In various embodiments, the third etch-stop layer 270 can be a dielectric material, including, but not limited to, silicon nitride (SiN), silicon boronitride (SiBN), silicon carbonitride (SiCN), silicon boro carbonitride (SiBCN), and combinations thereof.

In various embodiments, the third etch-stop layer 270 can have a thickness in a range of about 5 nm to about 30 nm, or about 5 nm to about 15 nm, or about 10 nm to about 30 nm, although other thicknesses are also contemplated. The third etch-stop layer 270 can be thick enough to allow a pattern to be etched into an overlying first hardmask layer without reaching the underlying second dielectric layer 260.

In one or more embodiments, a third hardmask layer 280 can be formed on the third etch-stop layer 270, where the third hardmask layer 280 can be formed by a blanket deposition. In various embodiments, the third hardmask layer 280 can be a metal compound material, including, but not limited to, titanium nitride (TiN), tantalum nitride (TaN), tungsten nitride (WN), titanium carbide (TiC), tantalum carbide (TaC), and combinations thereof.

In various embodiments, the third hardmask layer 280 can have a thickness in a range of about 5 nm to about 30 nm, or about 5 nm to about 15 nm, or about 10 nm to about 30 nm, although other thicknesses are also contemplated.

In one or more embodiments, a third softmask layer 290 can be formed on the third hardmask layer 280, where the third softmask layer 290 can be formed by CVD, PECVD, ALD, and combinations thereof. In various embodiments, the second softmask layer 290 can be tetraethyl orthosilicate (TEOS), where the TEOS can be deposited to form a silicon oxide (SiO).

In various embodiments, the third softmask layer 290 can have a thickness in a range of about 5 nm to about 30 nm, or about 5 nm to about 15 nm, or about 10 nm to about 30 nm, although other thicknesses are also contemplated.

Figure 10:
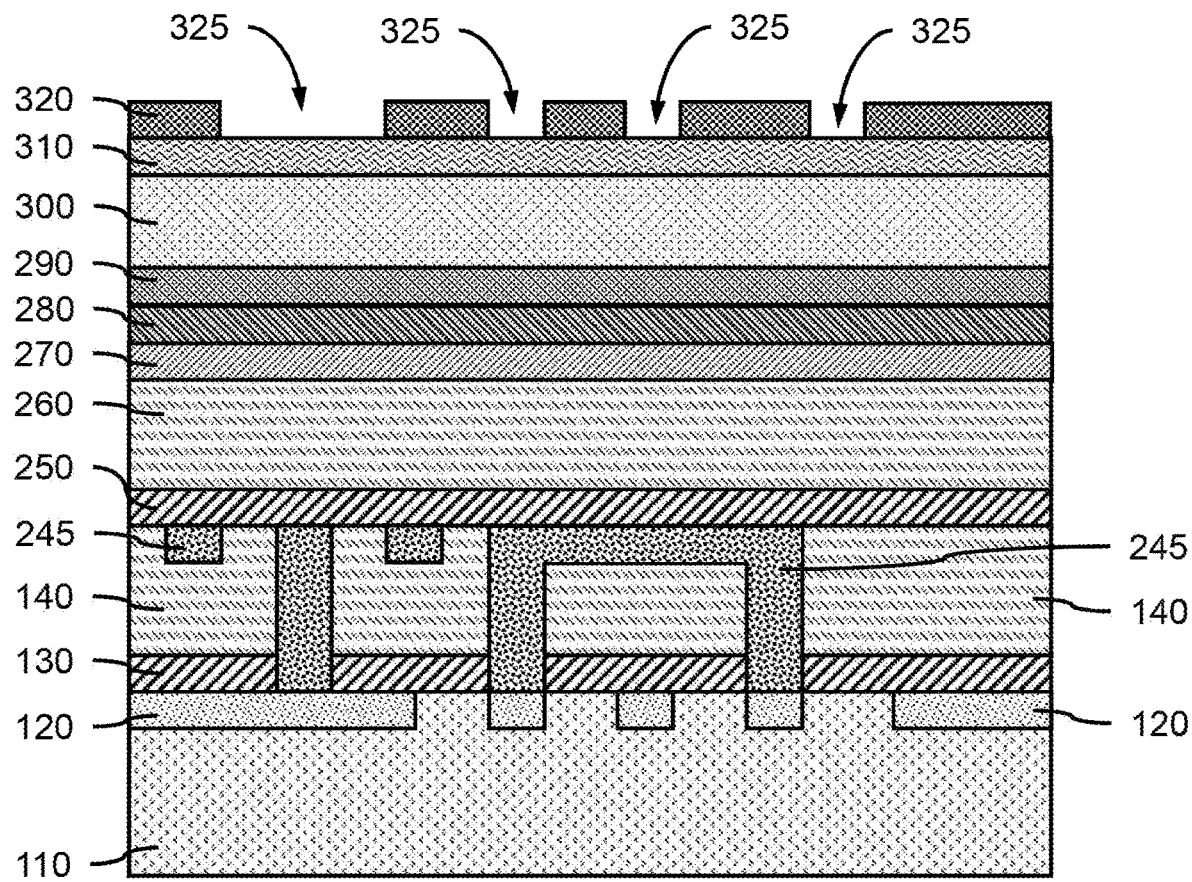
FIG. 10 is a cross-sectional side view showing a patterned second resist layer formed on a second SiARC layer and a third organic planarization layer, in accordance with an embodiment of the present invention.

FIG. 10 is a cross-sectional side view showing a patterned second resist layer formed on a second SiARC layer and a third organic planarization layer, in accordance with an embodiment of the present invention.

In one or more embodiments, a third organic planarization layer (OPL-3) 300 can be formed on the third softmask layer 290, where the third organic planarization layer (OPL-3) 300 can be formed by a spin-on processes. In various embodiments, the third organic planarization layer (OPL-3) 300 can be a photo-sensitive organic polymer.

In various embodiments, the third organic planarization layer (OPL-3) 300 can have a thickness in a range of about 60 nm to about 200 nm, or about 60 nm to about 150 nm, or about 100 nm to about 200 nm, although other thicknesses are also contemplated.

In one or more embodiments, a third silicon anti-reflection coating (SiARC) layer 310 can be formed on the OPL-3 layer 300, where the third SiARC layer 310 can be formed by a blanket deposition. The third SiARC layer 310 can include a silicon-containing base polymer.

In various embodiments, the third SiARC layer 310 can have a thickness in a range of about 10 nm to about 65 nm, or about 10 nm to about 35 nm, or about 15 nm to about 65 nm, although other thicknesses are also contemplated.

In one or more embodiments, a third patterned resist layer 320 can be formed on the third silicon anti-reflection coating layer 310, where the third resist layer can be formed by a spin-on process and patterned using lithography techniques. The third resist layer can be patterned to expose predetermined portions of the underlying third SiARC layer 310. The openings 325 in the third patterned resist layer 320 that expose portions of the third SiARC layer 310 can be positioned above particular components of the arrangement of conductive lines 120, so subsequent etching can form trenches for a second metallization layer where vias and connecting conductive lines are intended to be formed. Each of the resist openings 355 in the third patterned resist layer 320 can be laterally aligned with a first metallization layer section 245, and/or conductive line 120 on the substrate 110.

In various embodiments, the openings 325 in the third patterned resist layer 320 can be positioned such that the edges of the openings 325 are over portions of the first metallization layer sections 245.

Figure 11:
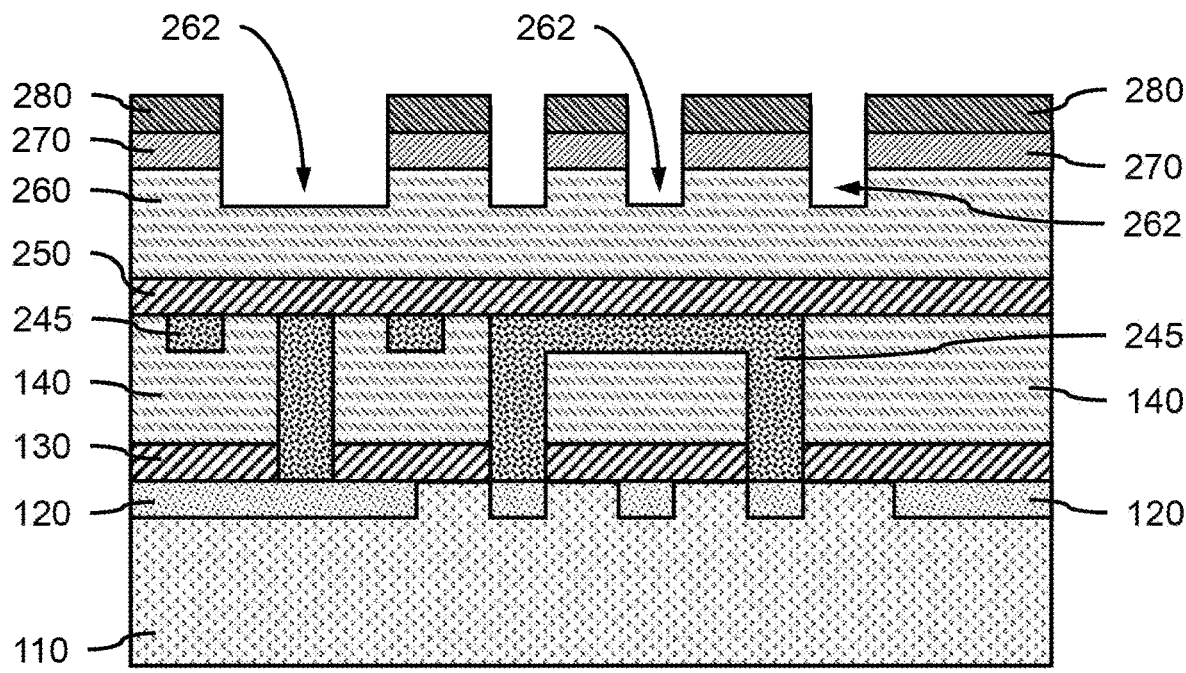
FIG. 11 is a cross-sectional side view showing the pattern of the third resist layer transferred to the third SiARC layer and through the third organic planarization layer into the third hardmask layer, third etch stop layer, and an upper portion of the second dielectric layer, in accordance with an embodiment of the present invention.

FIG. 11 is a cross-sectional side view showing the pattern of the third resist layer transferred to the third SiARC layer and through the third organic planarization layer into the third hardmask layer, third etch stop layer, and an upper portion of the second dielectric layer, in accordance with an embodiment of the present invention.

In one or more embodiments, one or more directional etches (e.g., RIE) can be used to remove portions of each of the layers beneath the openings 325 in the third patterned resist layer 320, where removal of the portions of each of the intervening layers can form a trench to the second dielectric layer 260. An upper portion of the second dielectric layer 260 can be removed using a timed directional etch (e.g., RIE) to form channels 262 in the upper portion of the second dielectric layer 260. The channels can be positioned over the first metallization layer sections 245.

In one or more embodiments, the second softmask layer 290 can be removed after forming the channels 262 and removing the third organic planarization layer (OPL-3) 300 before removing the second dielectric layer 260 and the third SiARC layer, which can be removed when etching the third hardmask layer 280. Removing the second softmask layer 290 can expose the remaining portion of the underlying third hardmask layer 280.

Figure 12:
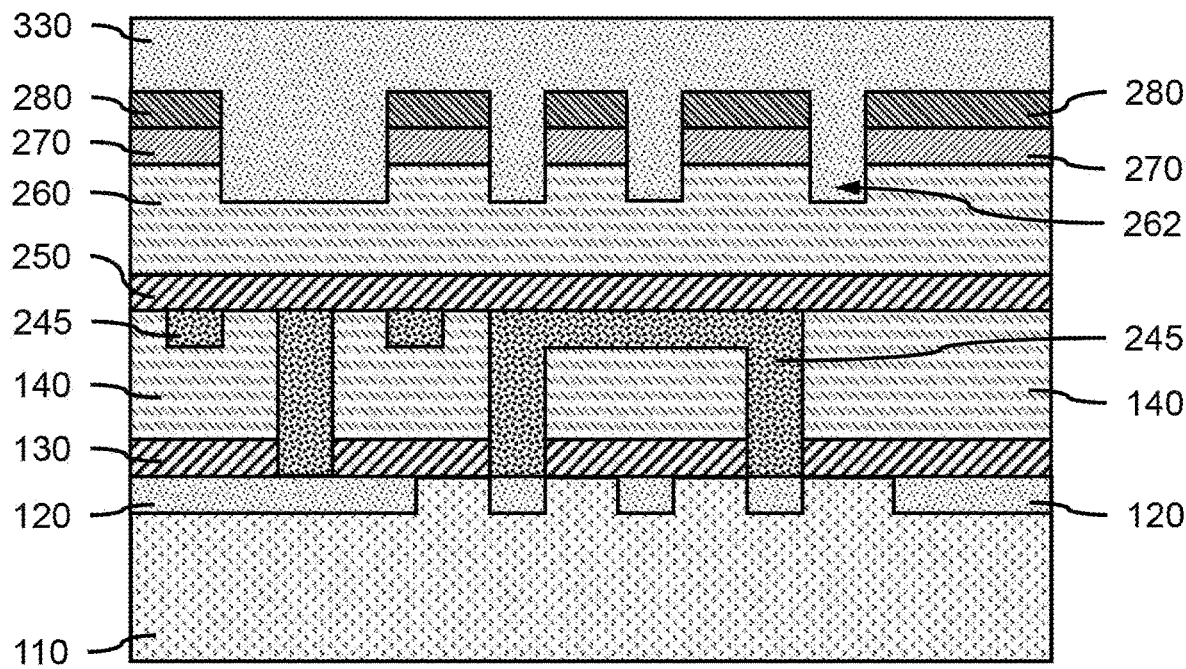
FIG. 12 is a cross-sectional side view showing channels formed in the second dielectric layer filled with a second metallization layer, in accordance with an embodiment of the present invention.

FIG. 12 is a cross-sectional side view showing channels formed in the second dielectric layer filled with a second metallization layer, in accordance with an embodiment of the present invention.

In one or more embodiments, a second metallization layer 330 can be formed in the channels 262 and openings in the third etch-stop layer 270 and on the exposed surfaces of the third hardmask layer 280. The second metallization layer 330 can be formed by a blanket deposition that fills in the channels 262 in the upper portion of the second dielectric layer 260 and covers the exposed surfaces of the third etch-stop layer 270 and on the exposed surfaces of the third hardmask layer 280, where the second metallization layer 330 can extend above the third hardmask layer 280.

In various embodiments, the third etch-stop layer 270 and third hardmask layer 280 can be removed before forming the second metallization layer 330, for example by a directional etch and/or isotropic etch.

In various embodiments, the second metallization layer 330 can be a conductive material, including, but not limited to, metals, (e.g., copper (Cu), cobalt (Co), aluminum (Al), gold (Au), silver (Ag), tungsten (W), ruthenium (Ru), molybdenum (Mo)), conductive metal compounds (e.g., tantalum nitride (TaN), titanium nitride (TiN), tantalum carbide (TaC), titanium carbide (TiC)), metal alloys (e.g., titanium aluminum (TiAl), graphene, carbon nanotubes, and combinations thereof.

Figure 13:
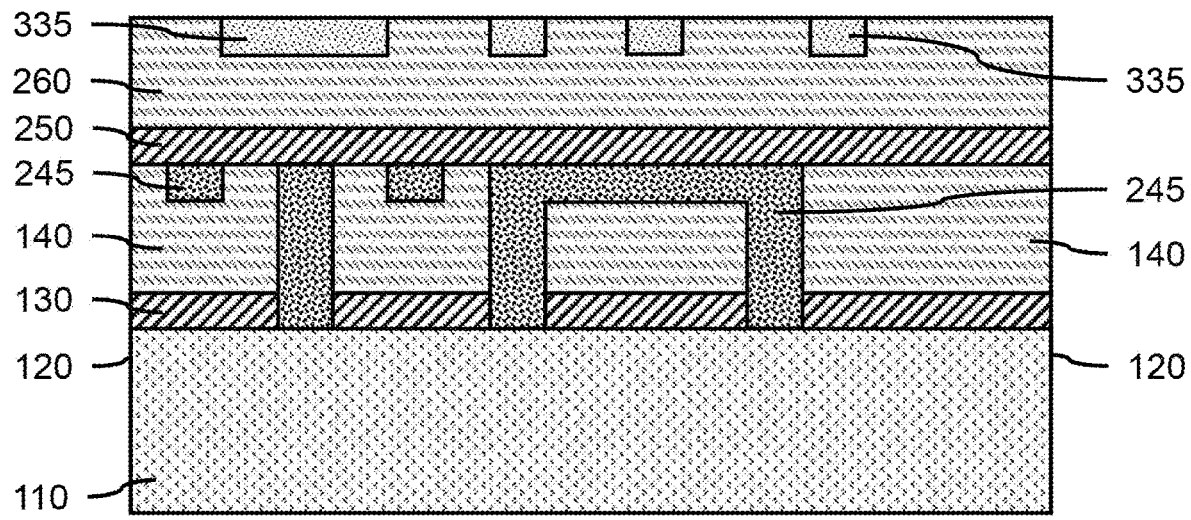
FIG. 13 is a cross-sectional side view showing the third hardmask layer and third etch-stop layer removed, and the second metallization layer planarized in the channels, in accordance with an embodiment of the present invention.

FIG. 13 is a cross-sectional side view showing the third hardmask layer and third etch-stop layer removed, and the second metallization layer planarized in the channels, in accordance with an embodiment of the present invention.

In one or more embodiments, the portion of the second metallization layer 330 extending beyond the channels 262 can be removed along with the third hardmask layer 280 and third etch-stop layer 270 using etching (e.g., wet chemical etching, dry plasma etching), chemical-mechanical polishing (CMP), and combinations thereof. The portion of the second metallization layer 330 in the channels 262 can remain to form second metallization layer sections 335 having a top surface at or below the top surface of the second dielectric layer 260.

Figure 14:
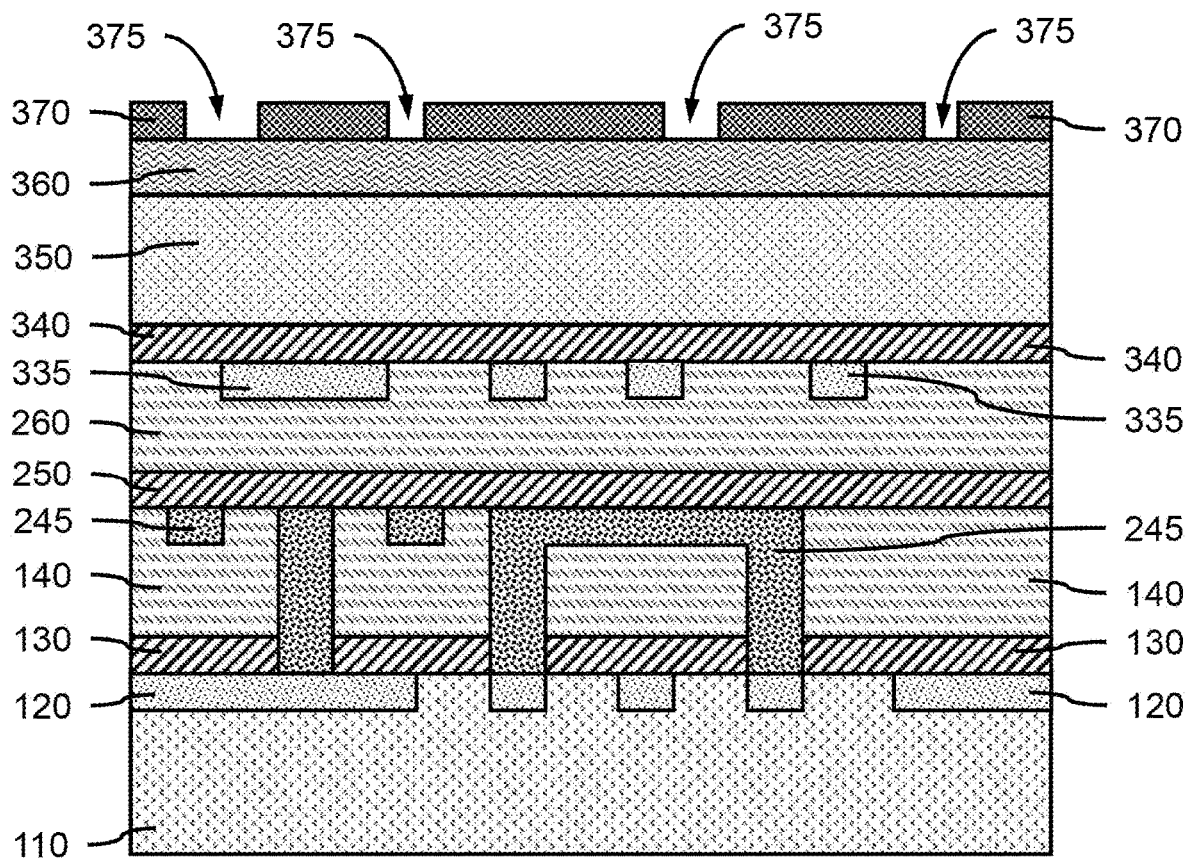
FIG. 14 is a cross-sectional side view showing a third capping layer formed on the second metallization layer sections, a fourth OPL layer formed on the third capping layer, a fourth SiARC layer formed on the fourth OPL layer, and a patterned fourth resist layer formed on the fourth SiARC layer, in accordance with an embodiment of the present invention.

FIG. 14 is a cross-sectional side view showing a third capping layer formed on the second metallization layer sections, a fourth OPL layer formed on the third capping layer, a fourth SiARC layer formed on the fourth OPL layer, and a patterned fourth resist layer formed on the fourth SiARC layer, in accordance with an embodiment of the present invention.

In one or more embodiments, a third capping layer 340 can be formed on the second metallization layer sections 335 and second dielectric layer 260, where the third capping layer 340 can be formed by a blanket deposition that covers the exposed surfaces of the second metallization layer sections 335 and second dielectric layer 260.

In one or more embodiments, the third capping layer 340 can be formed by a conformal deposition, for example, atomic layer deposition (ALD) and plasma enhanced ALD (PEALD), a blanket deposition, for example, chemical vapor deposition (CVD) and plasma enhanced CVD (PECVD), or a combination thereof.

In various embodiments, the third capping layer 340 can be a hardmask material, including, but not limited to, silicon nitride (SiN), silicon oxy nitride (SiON), silicon boronitride (SiBN), silicon carbo nitride (SiCN), silicon boro carbonitride (SiBCN), and combinations thereof.

In various embodiments, the third capping layer 340 can have a thickness in a range of about 5 nanometers (nm) to about 50 nm, or about 10 nm to about 30 nm, or about 15 nm to about 20 nm, although other thicknesses are also contemplated. The third capping layer 340 can be sufficiently thick to prevent metal atoms of the second metallization layer sections 335 from diffusing into overlying layers.

In one or more embodiments, a fourth organic planarization layer (OPL-4) 350 can be formed on the third capping layer 340, where the fourth organic planarization layer (OPL-4) 350 can be formed by a spin-on processes. In various embodiments, the fourth organic planarization layer (OPL-4) 350 can be a photo-sensitive organic polymer.

In various embodiments, the fourth organic planarization layer (OPL-4) 350 can have a thickness in a range of about 60 nm to about 200 nm, or about 60 nm to about 150 nm, or about 60 nm to about 100 nm, or about 100 nm to about 200 nm, although other thicknesses are also contemplated.

In one or more embodiments, a fourth silicon anti-reflection coating (SiARC) layer 360 can be formed on the OPL-4 layer 350, where the fourth SiARC layer 360 can be formed by a blanket deposition. The fourth SiARC layer 360 can include a silicon-containing base polymer.

In various embodiments, the fourth SiARC layer 360 can have a thickness in a range of about 10 nm to about 65 nm, or about 10 nm to about 35 nm, or about 15 nm to about 65 nm, although other thicknesses are also contemplated.

In one or more embodiments, a fourth patterned resist layer 370 can be formed on the fourth silicon anti-reflection coating layer 360, where a fourth resist layer can be formed by a spin-on process and patterned using lithography techniques. The fourth resist layer can be patterned to expose predetermined portions of the underlying fourth SiARC layer 360. The resist openings 375 in the fourth patterned resist layer 370 that expose portions of the fourth SiARC layer 360 can be positioned above particular components of the arrangement of conductive lines 120, first metallization layer sections 245 and second metallization layer sections 335, so subsequent etching can form trenches for a third metallization layer where vias and connecting conductive lines are intended to be formed. Each of the resist openings 375 in the fourth patterned resist layer 370 can be laterally aligned with a second metallization layer section 335, first metallization layer section 245, and/or conductive line 120 on the substrate 110.

In various embodiments, the resist openings 375 in the fourth patterned resist layer 370 can be positioned such that the edges (i.e., sidewalls) of the openings 375 are over portions of the second metallization layer sections 335. One of the sidewalls (i.e., edges) of a resist opening 375 can be located above a conductive section of the second metallization layer sections 335, and another sidewall (edge) of the same resist opening 375 can be located over a non-conductive portion of the second dielectric layer 260, such that a trench formed through the layers below the resist opening 375 would intersect with an edge (i.e., sidewall) of the underlying second metallization layer section 335. Placement of the edges (i.e., sidewalls) of the resist openings 375 can, thereby, have a wider tolerance due to the intersection of a subsequently formed trench with the second metallization layer section 335. The wide tolerance for placement can allow placement of the vertical trenches and subsequent vias at the ends of conductive lines formed by the second metallization layer sections 335. The placement of the resist openings 375 at the ends of the conductive lines formed by the second metallization layer sections 335 can save space by shortening the conductive line, while providing more precise control of via formation without relying on the via profile and chamfer height through the self-alignment of the trench edge with the sidewall of the underlying second metallization layer section 335.

In various embodiments, the resist openings 375 can have a width in a range of about 20 nm to about 70 nm, or about 20 nm to about 40 nm, or about 30 nm to about 70 nm, although other widths are also contemplated.

Figure 15:
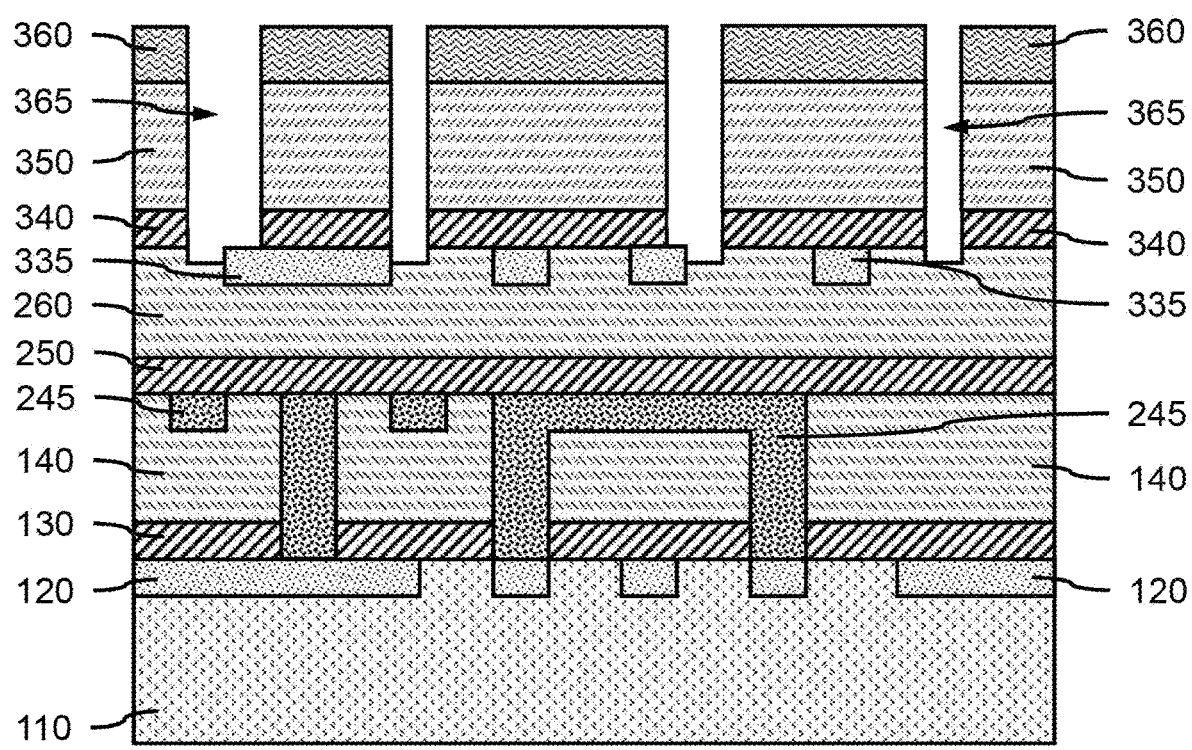
FIG. 15 is a cross-sectional side view showing the pattern of the patterned third resist layer transferred through the underlying layers to the second metallization layer sections and second dielectric layer, in accordance with an embodiment of the present invention.

FIG. 15 is a cross-sectional side view showing the pattern of the patterned third resist layer transferred through the underlying layers to the second metallization layer sections and second dielectric layer, in accordance with an embodiment of the present invention.

In one or more embodiments, the resist openings 375 can be extended through the exposed portions of the fourth silicon anti-reflection coating (SiARC) layer 360 and underlying fourth organic planarization layer (OPL-4) 350 to the third capping layer 340 to form trench(es) 365 using a directional etch (e.g., RIE). The trenches 365 can be extended through the third capping layer 340 into the second dielectric layer 260 using a directional etch (e.g., RIE), where the trench 365 can overlap the edge (i.e., sidewall) of an end of a conductive line formed by second metallization layer section 335. The second metallization layer section 335 can be a blocking layer that masks the underlying layer of the second dielectric layer 260. The fourth organic planarization layer (OPL-4) 350 can be an overlying layer above the second metallization layer section 335. The trenches 365 can be a hole through the fourth organic planarization layer (OPL-4) 350 that intersect and overlap a portion of the blocking layer formed by second metallization layer section 335.

Figure 16:
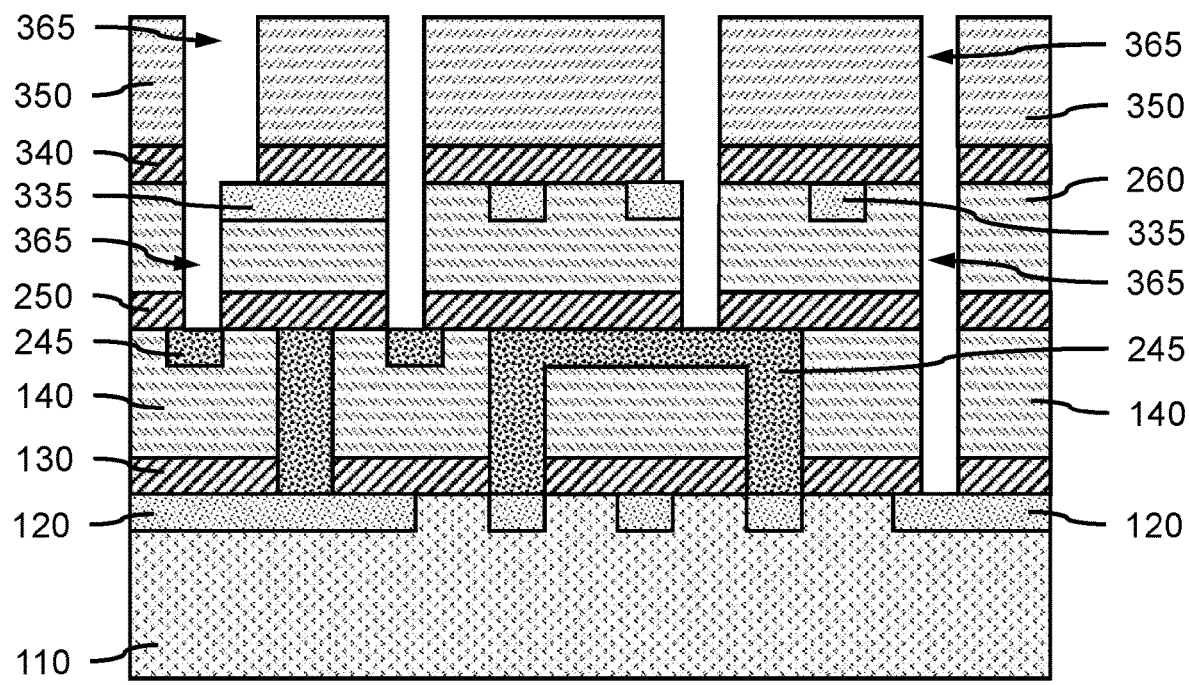
FIG. 16 is a cross-sectional side view showing the pattern of a patterned third resist layer transferred through the second dielectric layer to the first metallization layer and conductive lines, in accordance with an embodiment of the present invention.

FIG. 16 is a cross-sectional side view showing the pattern of a patterned third resist layer transferred through the second dielectric layer to the first metallization layer and conductive lines, in accordance with an embodiment of the present invention.

In one or more embodiments, the trenches 365 can be extended past the second metallization layer section(s) 335, through the second dielectric layer 260 and second capping layer 250 to the underlying first metallization layer sections 245. In various embodiments, a portion of a second metallization layer section 335 can mask underlying portions of the second dielectric layer 260, where the edge of the trench can be shifted inwards, such that the trench at the second metallization layer section 335 and through the second dielectric layer 260 and second capping layer 250 can be narrower than the initial overlying resist openings 375. The trenches 365 through the second capping layer 250 can expose portions of the first metallization layer sections 245. The section of trenches 365 through the second dielectric layer 260 can form a smaller hole than the section of the trenches 365 through the overlying fourth organic planarization layer (OPL-4) 350 and third capping layer 340.

In one or more embodiments, one or more trenches 365 can be extended through the second capping layer 250 and first dielectric layer 140 to conductive lines 120 to form one or more skip vias. The one or more trenches 365 can be extended using a directional etch (e.g., RIE). The skip via can be a third hole through the overlying fourth organic planarization layer (OPL-4) 350, third capping layer 340, second dielectric layer 260, second capping layer 250, and first dielectric layer 140. The third hole can be filled with a conductive material to form a skip via.

Figure 17:
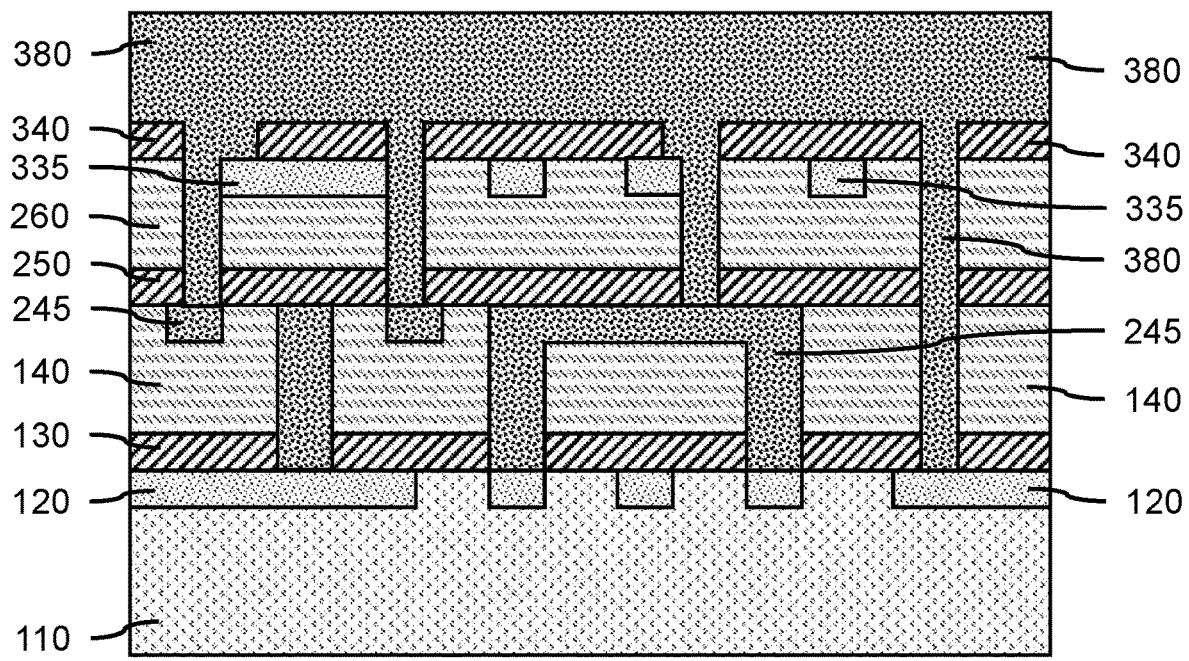
FIG. 17 is a cross-sectional side view showing the openings formed by the fourth patterned resist layer filled with a fourth metallization layer, in accordance with an embodiment of the present invention.

FIG. 17 is a cross-sectional side view showing the openings formed by the fourth patterned resist layer filled with a fourth metallization layer, in accordance with an embodiment of the present invention.

In one or more embodiments, a fourth metallization layer 380 can be formed in the trenches 365 and on the third capping layer 340 after removing the fourth organic planarization layer (OPL-4) 350. The fourth metallization layer 380 can be formed by for example, a conformal deposition, for example, atomic layer deposition (ALD) and plasma enhanced ALD (PEALD), a blanket deposition, for example, chemical vapor deposition (CVD) and plasma enhanced CVD (PECVD), or a combination thereof. The fourth organic planarization layer (OPL-4) 350 can be removed using RIE and/or a selective isotropic etch (e.g., wet chemical etch) and/or CMP. The fourth metallization layer 380 can be in the trenches 365 and can be in physical and electrical contact with at least portions of first metallization layer sections 245 and second metallization layer sections 335. The fourth metallization layer 380 can be in the trenches 365 and can be in physical and electrical contact with at least portions of conductive lines 120 to form skip vias 387.

Figure 18:
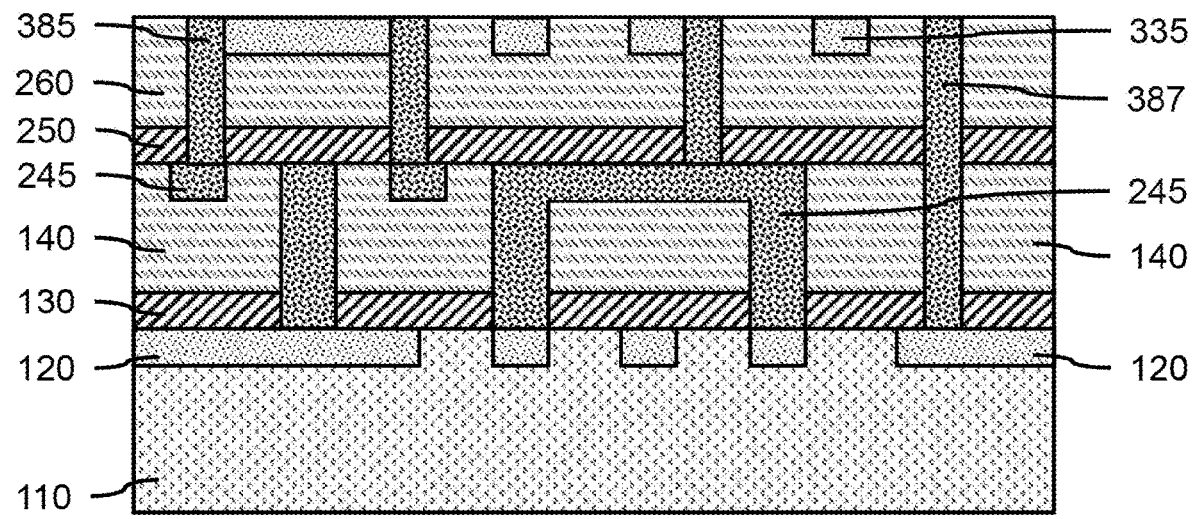
FIG. 18 is a cross-sectional side view showing the fourth metallization layer planarized, in accordance with an embodiment of the present invention.

FIG. 18 is a cross-sectional side view showing the fourth metallization layer planarized, in accordance with an embodiment of the present invention.

In one or more embodiments, portions of the fourth metallization layer 380 can be removed using, for example, CMP, and the remaining portions of the third capping layer 340 can be removed using for example, CMP, to form vias 385 between second metallization layer sections 335 and first metallization layer sections 245, and skip via(s) 387 to arrangement of conductive lines 120.

Figure 19:
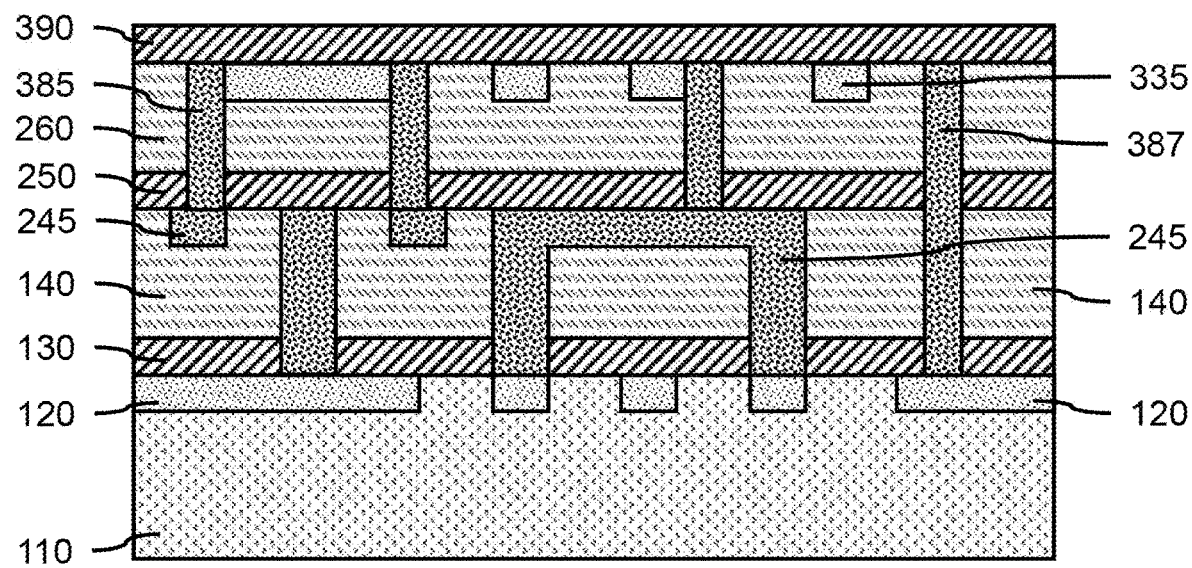
FIG. 19 is a cross-sectional side view showing a fourth capping layer formed on the vias and skip vias subsequent to planarizing the fourth metallization layer, in accordance with an embodiment of the present invention.

FIG. 19 is a cross-sectional side view showing a fourth capping layer formed on the vias and skip vias subsequent to planarizing the fourth metallization layer, in accordance with an embodiment of the present invention.

In one or more embodiments, the vias 385, skip via(s) 387, and second metallization layer sections 335 can be planarized using CMP, and a fourth capping layer 390 can be formed on the exposed surfaces. The fourth capping layer 390 can be formed by a conformal deposition, for example, atomic layer deposition (ALD) and plasma enhanced ALD (PEALD), a blanket deposition, for example, chemical vapor deposition (CVD) and plasma enhanced CVD (PECVD), or a combination thereof.

In various embodiments, the fourth capping layer 390 can be a hardmask material, including, but not limited to, silicon nitride (SiN), silicon oxy nitride (SiON), silicon boronitride (SiBN), silicon carbo nitride (SiCN), silicon boro carbonitride (SiBCN), and combinations thereof.

In various embodiments, the fourth capping layer 390 can have a thickness in a range of about 5 nanometers (nm) to about 50 nm, or about 10 nm to about 30 nm, or about 15 nm to about 20 nm, although other thicknesses are also contemplated. The fourth capping layer 390 can be sufficiently thick to prevent metal atoms of the vias 385, skip via(s) 387, and second metallization layer sections 335 from diffusing into overlying layers.

In various embodiments, the processes do not form chamfers on the second dielectric layer 260 due to the etching and metallization sequences, where the second metallization layer sections 335 can act as masks to provide sharp sidewalls to the trenches. The second metallization layer sections can define the edges of the vias, so the second dielectric layer does not have chamfering, from the directional etch (e.g., RIE) process used to form the trench(es) 365.

In a non-limiting exemplary embodiments, a method of forming vias and skip vias can include forming a patterned resist layer over second metallization layer sections, first metallization layer sections, and an arrangement of conductive lines on a substrate, wherein the patterned resist layer has one or more resist openings with at least one resist opening in the patterned resist layer laterally aligned with one second metallization layer section, one first metallization layer section, or one conductive line, wherein the at least one resist opening overlaps the edge of the one second metallization layer section, the one first metallization layer section, or the one conductive line. The method can further include extending the one or more resist openings through an intervening fourth organic planarization layer and third capping layer to the at least one second metallization layer section, one first metallization layer section, or one conductive line to form one or more trenches. The method can further include filling the one or more trenches with a fourth metallization layer, wherein the fourth metallization layer is in physical and electrical contact with at least one second metallization layer section, at least one first metallization layer section, and at least one conductive line.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming vias and skip vias comprising:
   forming a plurality of discontinuous conductive blocking layer sections on an underlying layer;
   forming an overlying layer on the plurality of discontinuous conductive blocking layer sections, wherein the overlying layer includes a hardmask capping layer on the discontinuous conductive blocking layer sections, an organic planarization layer on the hardmask capping layer, a silicon anti-reflection coating (MARC) layer on the organic planarization layer, and a resist layer on the SiARC layer;
   opening a first hole in the resist layer that overlaps one of the plurality of discontinuous conductive blocking layer sections;
   etching through the SiARC layer, the organic planarization layer, and the hardmask capping layer, and past the one discontinuous conductive blocking layer section into the underlying layer to form a second hole that is smaller than the first, hole in the overlying layer, wherein the second hole exposes at least a portion of a sidewall of the one discontinuous conductive blocking layer section and a portion of a metallization layer section; and
   forming a third hole in the overlying layer and underlying layer that does not intersect the plurality of discontinuous conductive blocking layer sections, wherein the third hole exposes a conductive line below the metallization layer section.

2. The method of claim 1, further comprising filling the first hole in the overlying layer and the second hole in the underlying layer with a conductive material to form a via that electrically connects the one discontinuous conductive blocking layer section with the metallization layer section.

3. The method of claim 2, wherein the plurality of discontinuous conductive block aver sections are made of a conductive material selected from the group consisting of copper (Cu), cobalt (Co), aluminum (Al), gold (Au), silver (Ag), tungsten (W), ruthenium (Ru), molybdenum (Mo), tantalum nitride (TaN), titanium nitride (TiN), tantalum carbide (TaC), titanium carbide (TiC)), titanium aluminum (TiAl), graphene, carbon nanotubes, and combinations thereof.

4. The method of claim 2, further comprising filling the third hole with a conductive material.

5. A method of forming vias and skip vias comprising:
   forming a patterned resist layer over a second metallization layer section, a first metallization layer section, and an arrangement of conductive lines on a substrate, wherein the patterned resist layer has at least one resist opening in the patterned resist layer laterally aligned with the second metallization layer section, the first metallization layer section, or the conductive line, wherein the at least one resist opening overlaps an edge of the second metallization layer section or the first metallization layer section;

extending the at least one resist opening through an intervening fourth organic planarization layer and third capping layer to the second metallization layer section, and to the first metallization layer section or the conductive lines to form one or more trenches for the vias and skip vias; and filling the one or more trenches with a fourth metallization layer, wherein the fourth metallization layer is in physical and electrical contact with the second metallization layer section, and the first metallization layer section or the conductive line to provide the vias and skip vias.

6. The method of claim 5, further comprising removing a portion of the fourth metallization layer to form the via and the skip via.

7. The method of claim 6, wherein a first capping layer is on the arrangement of conductive lines and the substrate, and the first metallization layer section is in a first dielectric layer on the first capping layer.

8. The method of claim 7, wherein the first metallization layer section is formed by forming the first dielectric layer on the first capping layer; depositing a first etch-stop layer on the first dielectric layer, depositing a first hardmask layer on the first etch-stop layer; depositing a first softmask layer on the first hardmask layer; and patterning the first softmask layer, first hardmask layer, first capping layer, and first dielectric layer using a first patterned resist layer and directional etching process.

9. The method of claim 7, wherein the second metallization layer section is in a second dielectric layer on a second capping layer on the first metallization layer section and the first dielectric layer.

10. The method of claim 9, wherein the second capping layer is made of a hardmask material selected from the group consisting of silicon nitride (SiN), silicon oxy nitride (SiON), silicon boronitride (SiBN), silicon carbo nitride (SiCN), silicon boro carbonitride (SiBCN), and combinations thereof.

11. The method of claim 9, wherein the via is in physical and electrical contact with the second metallization layer section and the first metallization layer section.

12. The method of claim 9, wherein a material of the second metallization layer section is a conductive material selected from the group consisting of copper (Cu), cobalt (Co), aluminum (Al), gold (Au), silver (Ag), tungsten (W), ruthenium (Ru) molybdenum (Mo)), tantalum nitride (TaN), titanium nitride (TiN), tantalum carbide (TaC), titanium carbide (TiC)), titanium aluminum (TiAl), graphene, carbon nanotubes, and combinations thereof.

13. A device, comprising:
an arrangement of conductive lines on a substrate;
a first capping layer on the substrate and the arrangement of conductive lines;
a first dielectric layer on the first capping layer;
a plurality of first metallization layer sections in the first dielectric layer that are in electrical contact with the arrangement of conductive lines;
a second capping layer on the plurality of first metallization layer sections;
a second dielectric layer on the second capping layer;
a plurality of second metallization layer sections in the second dielectric layer;
a via between at least one of the plurality of second metallization layer sections and at least one of the plurality of first metallization layer sections; and
one or more skip via(s) to at least one of the arrangement of conductive lines, wherein the plurality of second metallization layer sections define the edges of the vias, so the second dielectric layer does not have chamfering.

14. The device of claim 13, wherein a material of the second metallization layer section is a conductive material selected from the group consisting of copper (Cu), cobalt (Co), aluminum (Al), gold (Au), silver (Ag), tungsten (W), ruthenium (Ru), molybdenum (Mo), tantalum nitride (TaN), titanium nitride (TiN), tantalum carbide (TaC), titanium carbide (TiC)), titanium aluminum (TiAl), graphene, carbon nanotubes, and combinations thereof.

15. The device of claim 13, wherein the first dielectric layer has a thickness in a range of about 60 nm to about 200 nm.

16. The device of claim 13, wherein the via is in physical and electrical contact with a sidewall of the one second metallization layer section and a top surface of the one first metallization layer section.

17. The device of claim 13, wherein the second capping layer is made of a hardmask material selected from the group consisting of silicon nitride (SiN), silicon oxy nitride (SiON), boronitride (SiBN), silicon carbo nitride (SiCN), silicon born carbonitride (SiBCN), and combinations thereof.

18. The device of claim 17, wherein a material of the first metallization layer sections is a conductive material selected from the group consisting of copper (Cu), cobalt (Co), aluminum (Al), gold (Au), silver (Ag), tungsten (W), ruthenium (Ru) molybdenum (Mo)), tantalum nitride (TaN), titanium nitride (TiN), tantalum carbide (TaC), titanium carbide (TiC)), titanium aluminum (TiAl), graphene, carbon, nanotubes, and combinations thereof.

19. The device of claim 18, wherein the first capping layer has a thickness in a range of about 5 nanometers (nm) to about 50 nm.

* * * * *